US009837382B2

(12) United States Patent
Watanabe et al.

(10) Patent No.: US 9,837,382 B2
(45) Date of Patent: Dec. 5, 2017

(54) SEMICONDUCTOR PACKAGE AND MANUFACTURING METHOD THEREOF

(71) Applicant: J-DEVICES CORPORATION, Oita (JP)

(72) Inventors: Shinji Watanabe, Kanagawa (JP); Toshihiro Iwasaki, Kanagawa (JP); Michiaki Tamakawa, Kanagawa (JP)

(73) Assignee: J-DEVICE CORPORATION, Oita (JP)

( * ) Notice: Subject to any disclaimer, the term of this patent is extended or adjusted under 35 U.S.C. 154(b) by 0 days.

(21) Appl. No.: 15/089,630

(22) Filed: Apr. 4, 2016

(65) Prior Publication Data

US 2016/0300779 A1    Oct. 13, 2016

(30) Foreign Application Priority Data

Apr. 10, 2015 (JP) ................. 2015-080718

(51) Int. Cl.
| | |
|---|---|
| *H01L 23/373* | (2006.01) |
| *H01L 25/065* | (2006.01) |
| *H01L 25/00* | (2006.01) |
| *H01L 23/538* | (2006.01) |
| *H01L 21/48* | (2006.01) |
| *H01L 21/56* | (2006.01) |
| *H01L 23/00* | (2006.01) |

(Continued)

(52) U.S. Cl.
CPC ........ *H01L 25/0655* (2013.01); *H01L 21/568* (2013.01); *H01L 23/5389* (2013.01); *H01L 24/19* (2013.01); *H01L 24/20* (2013.01); *H01L 25/50* (2013.01); *H01L 23/3107* (2013.01); *H01L 23/36* (2013.01); *H01L 23/49844* (2013.01); *H01L 2021/60022* (2013.01)

(58) Field of Classification Search
CPC ............ H01L 23/3737; H01L 23/5389; H01L 23/5386; H01L 23/5383; H01L 23/5384; H01L 25/565; H01L 25/50; H01L 25/0655
See application file for complete search history.

(56) References Cited

U.S. PATENT DOCUMENTS 8,866,302 B2 * 10/2014 Ewe ..................... H01L 24/24
                                                            257/774
2006/0087045 A1 *  4/2006 Yamano ............... H01L 21/568
                                                            257/787

(Continued)

FOREIGN PATENT DOCUMENTS

JP         2012-099779 A        5/2012

*Primary Examiner* — Peniel M Gumedzoe
(74) *Attorney, Agent, or Firm* — Typha IP LLC

(57) ABSTRACT

Thermal resistance is reduced from an element surface of a semiconductor chip to the rear surface of a semiconductor package. Split patterning of a metal is easily carried out, stress produced by a thermal expansion coefficient between silicon and metal is significantly reduced and environment reliability is improved. Low cost is realized by manufacturing a semiconductor package without using a TIM material. A semiconductor package is provided including a semiconductor chip including a first surface and a second surface opposed to the first surface and covered with a resin, an electrode being arranged over the first surface, a first wiring connected to the first surface directly or via a first opening arranged in the resin, and a second wiring connected to the second surface via a second opening arranged in the resin.

10 Claims, 43 Drawing Sheets

(51) Int. Cl.
*H01L 21/60* (2006.01)
*H01L 23/31* (2006.01)
*H01L 23/36* (2006.01)
*H01L 23/498* (2006.01)

(56) References Cited

U.S. PATENT DOCUMENTS

| | | | |
|---|---|---|---|
| 2007/0284720 A1* | 12/2007 | Otremba | H01L 23/49524 257/690 |
| 2009/0230535 A1* | 9/2009 | Otremba | H01L 21/561 257/690 |
| 2009/0236749 A1* | 9/2009 | Otremba | H01L 23/36 257/774 |
| 2009/0261468 A1* | 10/2009 | Kroeninger | H01L 21/568 257/690 |
| 2010/0078783 A1* | 4/2010 | Otremba | H01L 23/5389 257/676 |
| 2011/0045634 A1* | 2/2011 | Pagaila | H01L 24/19 438/107 |
| 2011/0084382 A1* | 4/2011 | Chen | H01L 24/97 257/737 |
| 2012/0106109 A1 | 5/2012 | Kim et al. | |
| 2014/0197551 A1* | 7/2014 | Porwol | H01L 21/56 257/787 |
| 2015/0115475 A1* | 4/2015 | Palm | H01L 24/06 257/777 |

* cited by examiner

SEMICONDUCTOR PACKAGE AND MANUFACTURING METHOD THEREOF

CROSS REFERENCE TO RELATED APPLICATIONS

This application is based upon and claims the benefit of priority from the prior Japanese Patent Application No. 2015-080718, filed on Apr. 10, 2015, the entire contents of which are incorporated herein by reference.

FIELD

One embodiment of the present invention is related to a technology for achieving an improvement in the reduction of thermal resistance and environment reliability of a semiconductor package.

BACKGROUND

In the structure of a conventional semiconductor package, it is usual to use a thermal interface material (TIMI) for a thermal and mechanical connection between a semiconductor chip and a die pad mounted with the semiconductor chip. TIM is largely classified into a material in which a substance with high thermal conductivity such as an Ag paste is immersed into a resin, and a material in which a metal is bonded by welding such as a solder.

SUMMARY

A semiconductor package in an embodiment according to the present invention includes a semiconductor chip including a first surface and a second surface opposed to the first surface and covered with a resin, an electrode arranged over the first surface, a first wiring connected to the first surface directly or via a first opening arranged in the resin, and a second wiring connected to the second surface via a second opening arranged in the resin.

A semiconductor package in an embodiment according to the present invention includes a plurality of the semiconductor chips including a first surface and a second surface opposed to the first surface and covered with a resin, an electrode arranged over the first surface, a first wiring connected to the first surface directly or via a first opening arranged on the resin, and a second wiring connected to the second surface via a second opening arranged on the resin, a third wiring is electrically connected to the first wiring via a plurality of third openings arranged on the resin, and is electrically connected with an electrode of mutually different semiconductor chips among the plurality of semiconductor chips.

A method of manufacturing a semiconductor package in an embodiment according to the present invention includes placing a semiconductor chip above a fixing material, a first surface of the semiconductor chip is arranged facings upwards and a second surface opposing the first surface facings downwards, filling a first resin above the fixing material, to embed the semiconductor chip, forming a first opening in the first resin to expose the first surface, forming a first wiring above the first surface by a plating, removing the fixing material, filling a second material above the second surface and the first resin, forming a second opening in the second resin to expose the second surface, forming a plating resist above the second resin, and forming a second wiring above the second surface by a plating.

A method of manufacturing a semiconductor package in an embodiment according to the present invention includes placing a plurality of semiconductor chips above a fixing material, a first surface of the plurality of semiconductor chips are arranged faces upwards and a second surface opposing the first surface faces downwards, filling a first resin above the fixing material, to embed the plurality of semiconductor chips, forming a first opening in the first resin to expose the first surface, forming a first wiring above the first surface by a plating, removing the fixing material, filling a second material above the second surface and the first resin, forming a second opening in the second resin to expose the second surface and forming a third opening to expose the first wiring, and forming the second wiring above the second opening and the second resin by plating Cu above the second opening, third opening and second resin, and forming a third wiring above the third opening and second resin, the third wiring is electrically connected with an electrode of mutually different semiconductor chips among the plurality of semiconductor chips.

A method of manufacturing a semiconductor package in an embodiment according to the present invention coating a photosensitive resist on a support plate, forming an opening in a part of the photosensitive resist, forming a first wiring in the opening by a plating, performing a flip chip connection of a semiconductor chip including a second surface opposing a first surface arranged with an electrode, above the first wiring to connect the first wiring and the electrode, filling a resin above the support plate, to embed the semiconductor chip and the first wiring, forming a second opening in the resin to expose the second surface, forming a plating resist above the resin, and forming a second wiring above the second surface using a plating.

A method of manufacturing a semiconductor package in an embodiment according to the present invention coating a photosensitive resist on a support plate, forming an opening in a part of the photosensitive resist, forming a first wiring in the opening by a plating, performing a flip chip connection of a plurality of semiconductor chips including a second surface opposing a first surface arranged with an electrode, above the first wiring the first wiring and the electrode are connected, filling a resin above the support plate, to embed the plurality of semiconductor chips and the first wiring, forming a second opening in the second resin to expose the second surface and forming a third opening to expose the first wiring, and forming the second wiring above the second opening and the second resin by plating Cu above the second opening, third opening and second resin, and forming a third wiring above the third opening and second resin, the third wiring is electrically connected with an electrode of mutually different semiconductor chips among the plurality of semiconductor chips.

DESCRIPTION OF EMBODIMENTS

A semiconductor package related to the present invention is explained below while referring to the diagrams. However, the semiconductor package related to the present invention can be performed by many different forms and should not be interpreted as being limited to the content described in the embodiments illustrated herein. Furthermore, in the diagrams referenced by the present embodiment, the same reference symbols are attached to the same parts or parts that have similar functions and therefore repeated explanations are omitted.

A resin impregnated type TIM which is used in a thermal and mechanical connection between a semiconductor chip and a die pad mounted with the semiconductor chip in a semiconductor package is excellent from the viewpoint of relieving stress since it has a low modulus of elasticity. However, there is a problem whereby since the material strength itself is low, it is easy for it to break in an environmental test such as a temperature cycle test. Furthermore, there is a problem whereby since thermal conductivity is low, it is difficult to satisfy the specifications required by power devices and the like. In addition, a metal weld bonding type TIM has comparatively good thermal conductivity. However, since there is a very high level of stress due to a thermal expansion coefficient difference between a semiconductor chip and die pad, although breaking strength is comparatively high, a metal weld bonding type TIM breaks easily due to this thermal expansion coefficient difference.

One embodiment of the present invention is to reduce thermal resistance from an element surface arranged with an electrode of a semiconductor chip to a surface of a semiconductor package by performing direct metallization to the element surface arranged with the electrode of the semiconductor chip.

One embodiment of the present invention is to reduce thermal resistance from a rear surface of a semiconductor chip to a surface of a semiconductor package by performing direct metallization to the rear surface not arranged with an electrode of the semiconductor chip.

One embodiment of the present invention is to easily realize split patterning of a metal by applying a plating process in a manufacturing process, significantly reducing stress produced by a thermal expansion coefficient difference between silicon and metal, and improving environment reliability.

One embodiment of the present invention is to realize low cost by manufacturing a semiconductor package without using a TIM material.

First Embodiment

Figure 1:
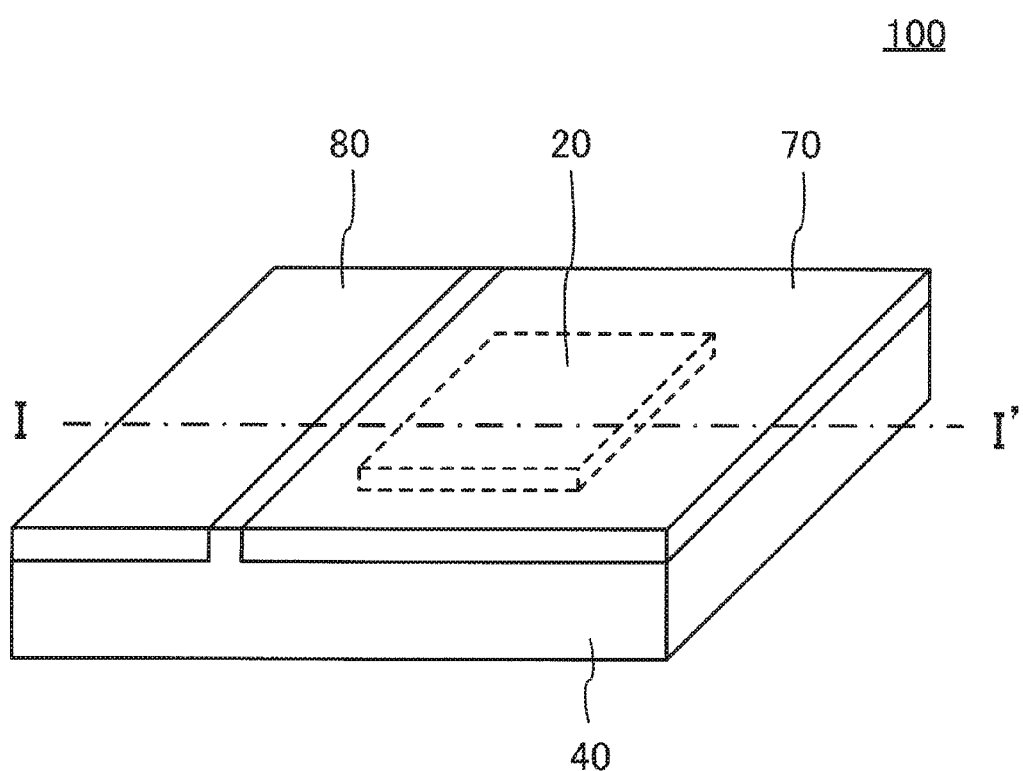
FIG. 1 is a schematic diagram of a semiconductor package related to a first embodiment of the present invention.

A semiconductor package and manufacturing method thereof related to the first embodiment are explained using FIG. 1 to FIG. 12.
—Entire Structure of a Semiconductor Package—
FIG. 1 is a schematic diagram showing the entire structure of a semiconductor package 100 related to the first embodiment. A semiconductor chip 20 is embedded within a resin 40. A second wiring 70 is connected to an upper surface of the semiconductor using a via. In addition, the first wiring is formed on the lower side of the semiconductor package 100 and is directly connected to an electrode of the semiconductor chip 20. In addition, the first wiring and a wiring 80 are electrically connected using a via.
—Manufacturing Method of a Semiconductor Package Related to the First Embodiment—
FIG. 2 to FIG. 12 show the sequence of a manufacturing process of the semiconductor package 100 related to the first embodiment of the present invention and show cross-sections along the line I-I' in FIG. 1.

Figure 2:
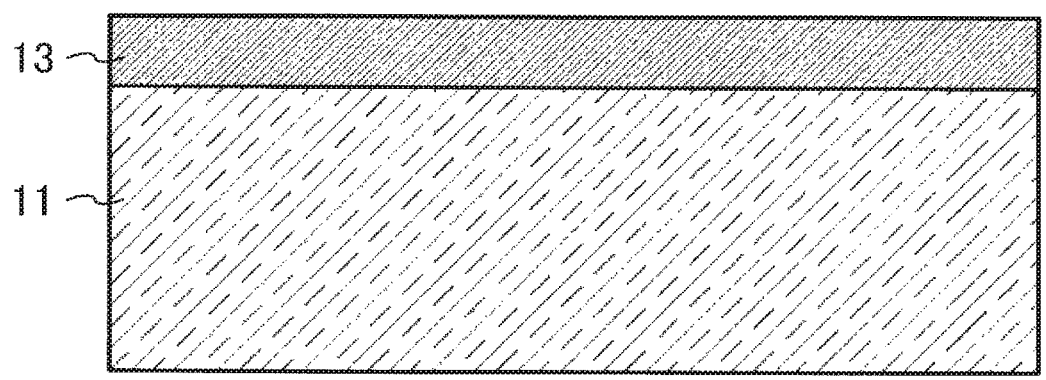
FIG. 2 is a cross-sectional diagram showing a manufacturing process of a semiconductor package related to a first embodiment of the present invention.

FIG. 2 shows a state whereby a photosensitive photoresist 13 is formed above a support plate 11. It is possible to favorably use copper (Cu) which has excellent properties as the support plate 11.

Figure 3:
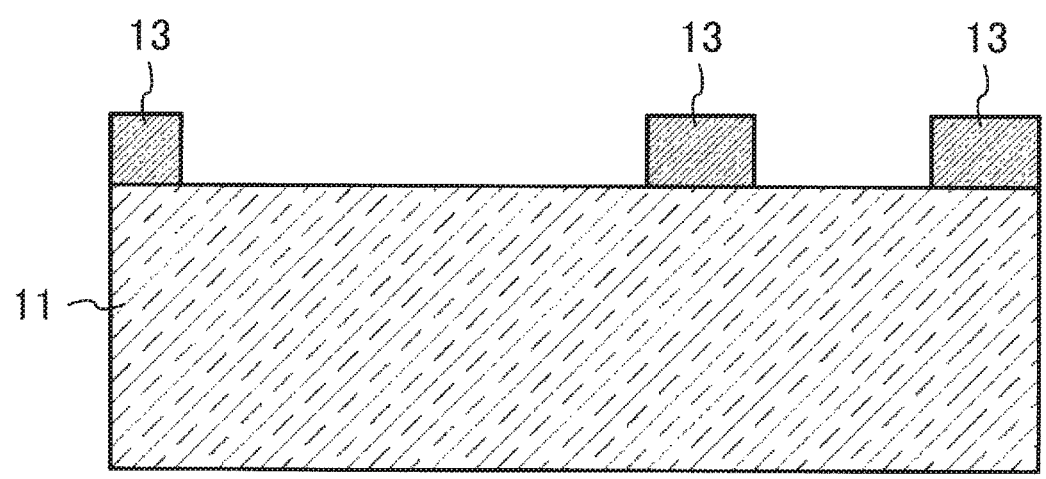
FIG. 3 is a cross-sectional diagram showing a manufacturing process of a semiconductor package related to a first embodiment of the present invention.

FIG. 3 shows a state after a photolithography process from FIG. 2. A certain wiring pattern is exposed and developed and an opening is formed in the photoresist 13.

Furthermore, although a formation method applying the photosensitive photoresist 13 was explained in FIG. 2 and FIG. 3, it is also possible to apply a non-photosensitive resist instead of the photoresist 13. In the case where a non-photosensitive resist is applied instead of the photoresist 13, an opening is formed using an excimer laser, carbon dioxide gas laser or YAG laser and the like after the non-photosensitive resist is arranged on the support plate 11 the same as in FIG. 2.

Figure 4:
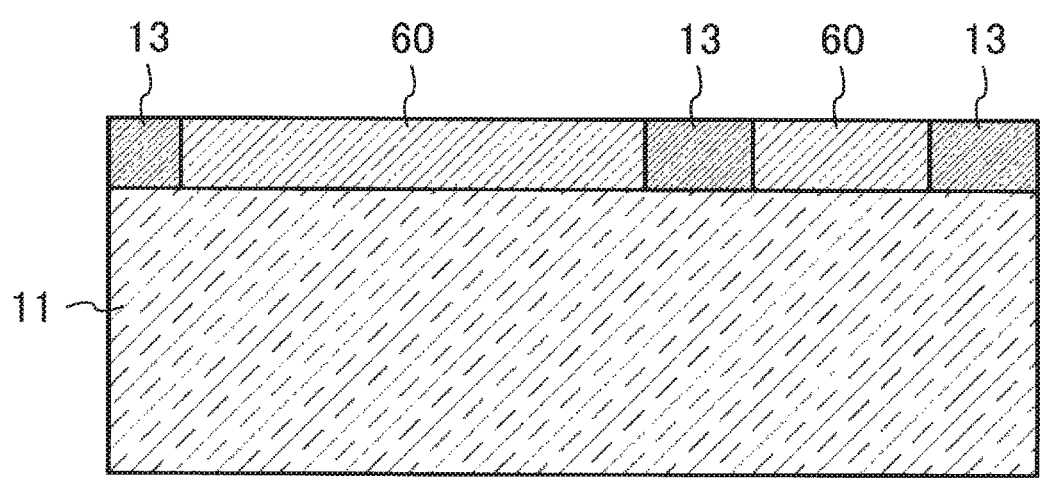
FIG. 4 is a cross-sectional diagram showing a manufacturing process of a semiconductor package related to a first embodiment of the present invention.

FIG. 4 shows a stage whereby the first wiring 60 is formed by plating. A metal such as Cu and the like can be favorably used as the first wiring 60. In order to protect an external terminal, the first wiring 60 may undergo a Cu plating process after a metal (Au) is plated on the lowermost layer and next nickel (Ni) is plated as a Cu etching barrier metal. Furthermore, the barrier metal may be formed by a plurality of metal layers, for example Ti/Cu, Ti/Ni/Au or Ti/Ni/Ag and the like.

Figure 5:
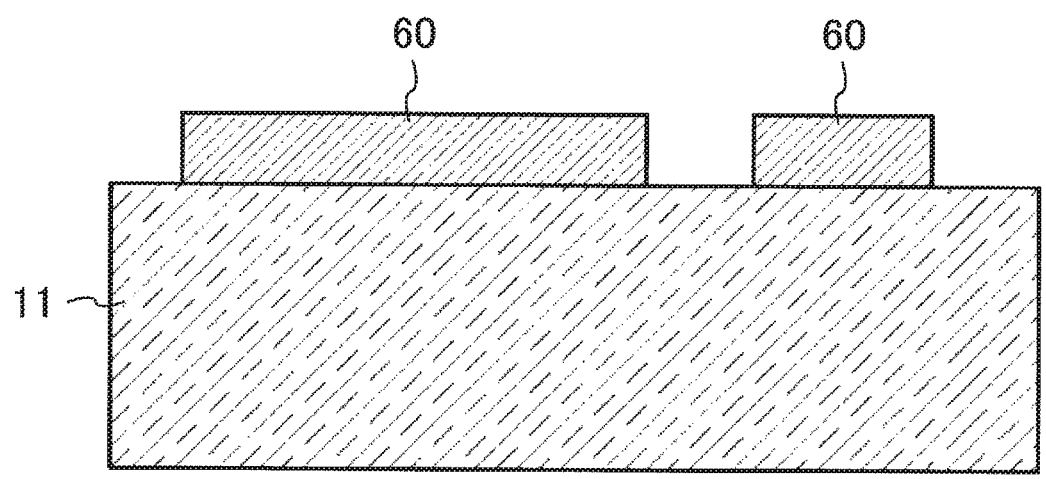
FIG. 5 is a cross-sectional diagram showing a manufacturing process of a semiconductor package related to a first embodiment of the present invention.

The photoresist 13 is stripped and removed after forming the first wiring 60 (see FIG. 5).

Figure 6:
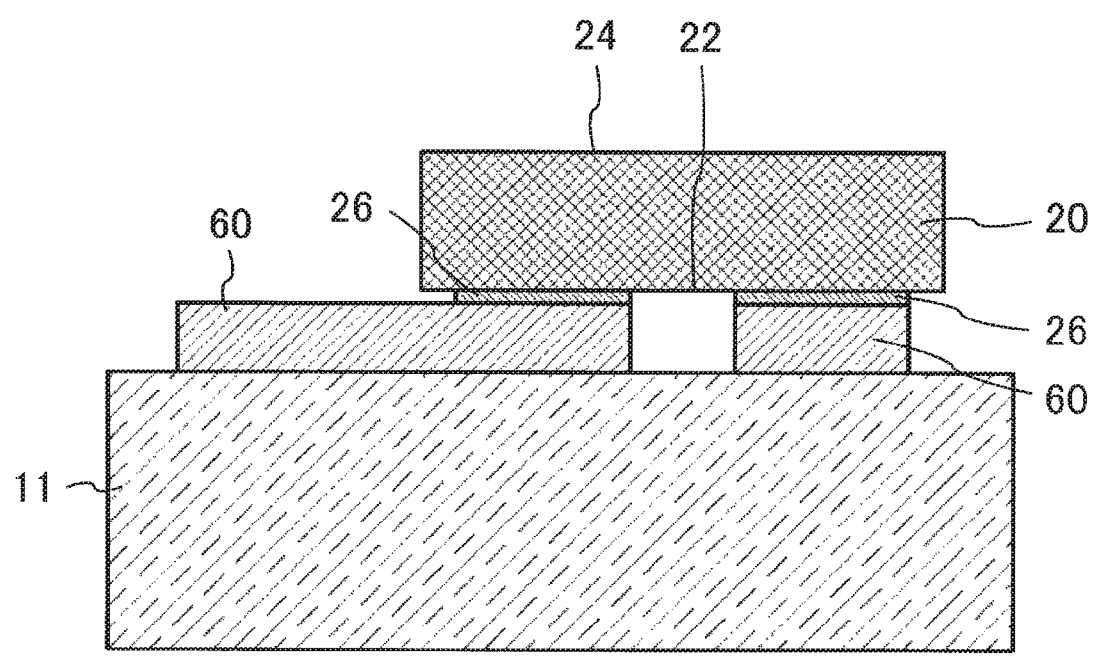
FIG. 6 is a cross-sectional diagram showing a manufacturing process of a semiconductor package related to a first embodiment of the present invention.

Next, the semiconductor chip 20 is mounted above the first wiring 60 using a flip chip process method (see FIG. 6). The semiconductor chip 20 includes an element surface (or first surface) 22 arranged with an electrode 26 and a rear surface (second surface) 24 opposing the element surface 22. Furthermore, "element surface" in the present specification includes a part arranged with the second electrode 26 and a surface of the semiconductor chip 20 not arranged with an electrode. The semiconductor chip 20 is mounted so that the element surface 22 is on the lower side (first wiring side) so that the electrode 26 is connected to the first wiring 60.

Figure 7:
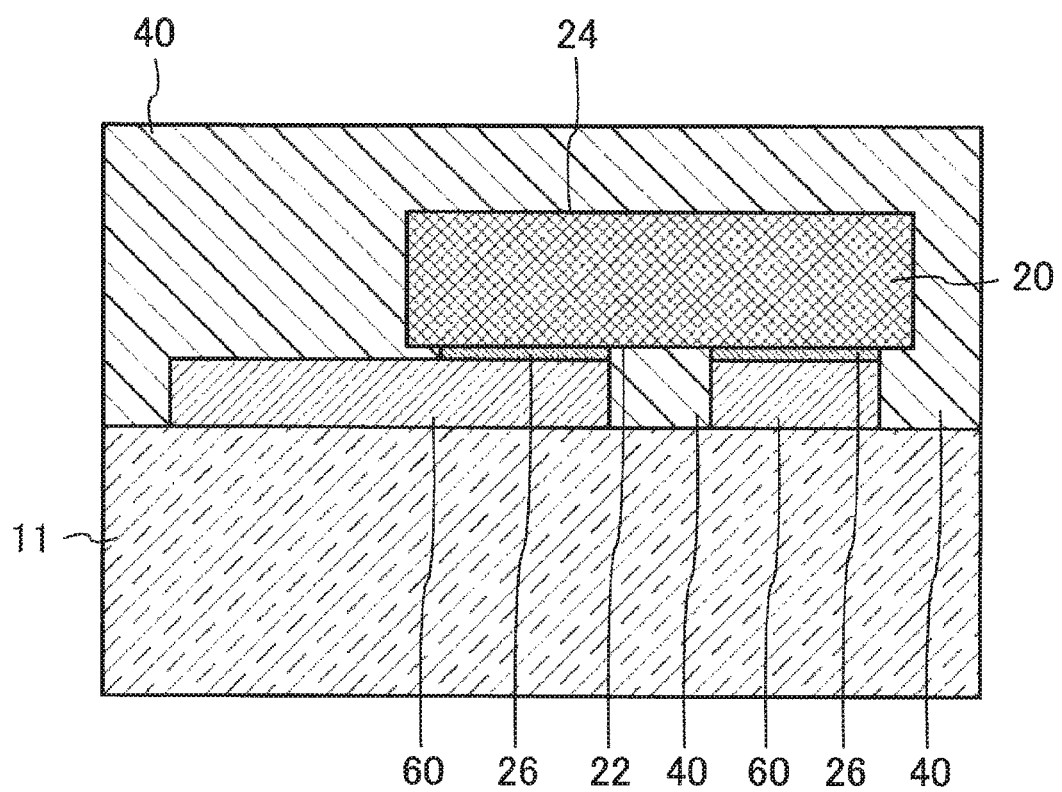
FIG. 7 is a cross-sectional diagram showing a manufacturing process of a semiconductor package related to a first embodiment of the present invention.

Next, a resin 40 is filled using a vacuum press method or the like so that the first wiring 60 and semiconductor chip 20 formed above the support plate 11 are sealed (see FIG. 7). A non-photosensitive resin or photosensitive may be used as the resin 40.

Figure 8:
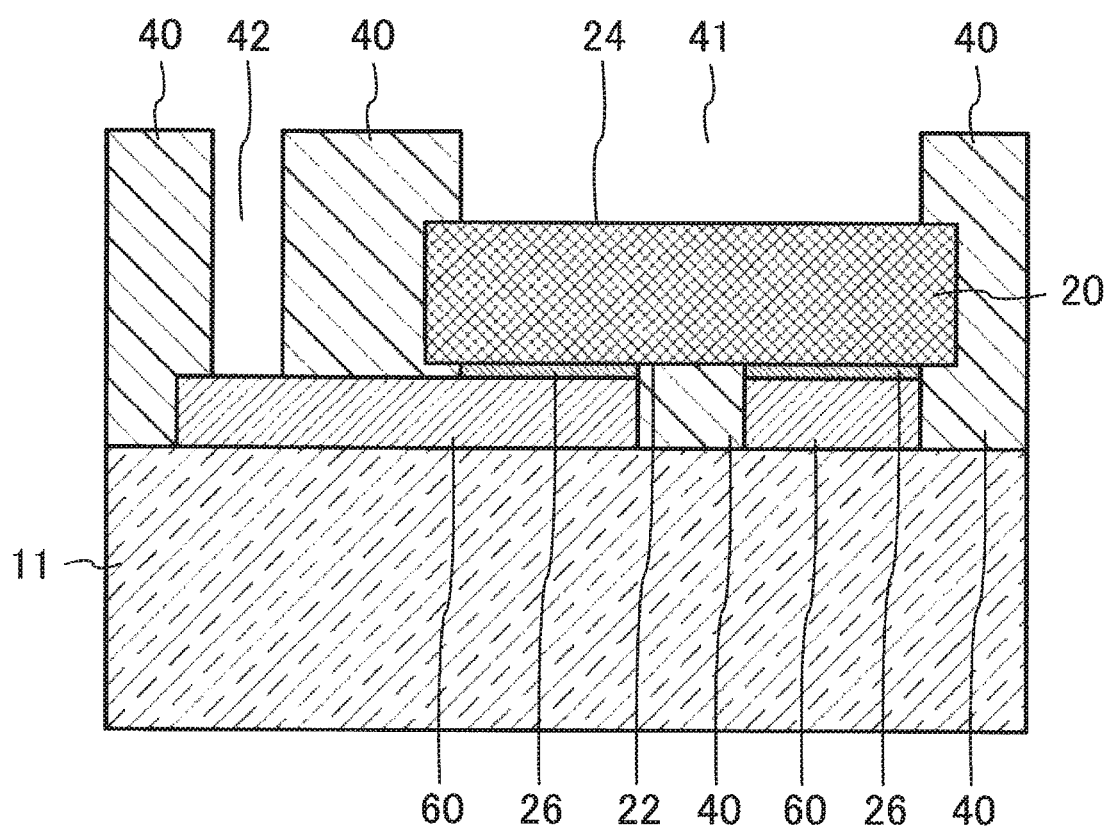
FIG. 8 is a cross-sectional diagram showing a manufacturing process of a semiconductor package related to a first embodiment of the present invention.

Next, an opening 41 and opening 42 are formed in the filled resin 40 (see FIG. 8). The opening 41 and opening 42 are formed in a certain position so as to the expose the rear surface 24 of the semiconductor chip 20 and expose the first wiring 60 respectively. The opening 41 which exposes the rear surface 24 of the semiconductor chip 20 may also be an aperture having a rectangular shaped comparatively large diameter matching the shape of the semiconductor chip 20.

The opening 41 and the opening 42 are formed by applying an excimer laser or the like in the case where a non-photosensitive resin is used for the resin 40. The opening 41 and the opening 42 formed by applying an exposure/development method in the case where a photosensitive resin is used for the resin 40. After forming the opening 41 and the opening 42 in the resin, A metal film of titanium (Ti), Cu or the like is formed on the entire area of the resin 40 including the opening 41 and the opening 42 by sputtering.

Figure 9:
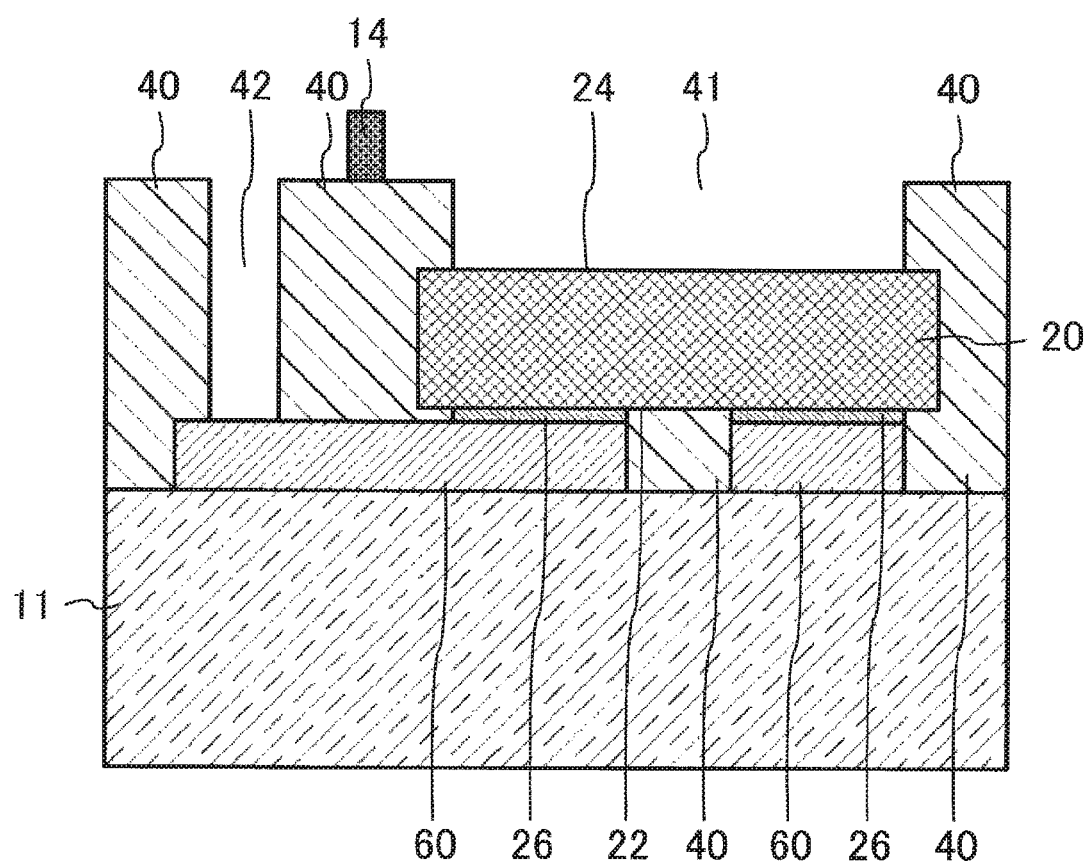
FIG. 9 is a cross-sectional diagram showing a manufacturing process of a semiconductor package related to a first embodiment of the present invention.
Figure 10:
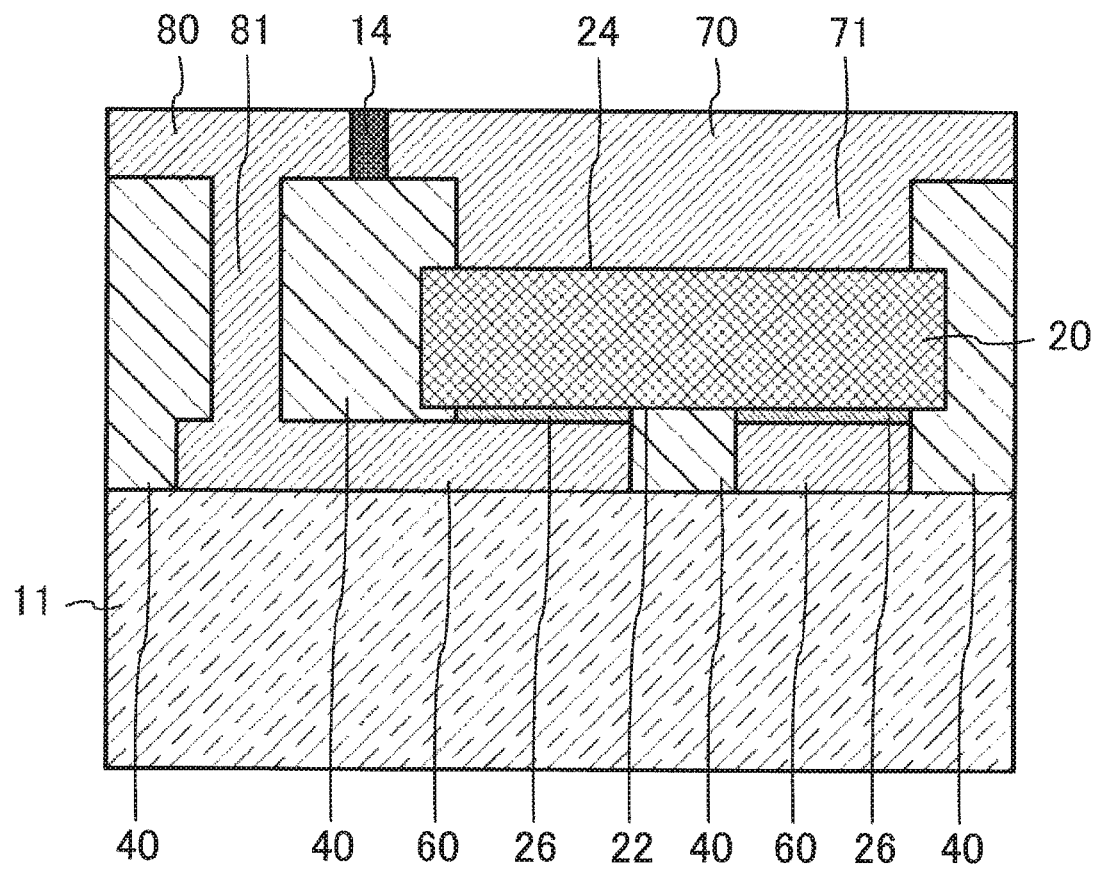
FIG. 10 is a cross-sectional diagram showing a manufacturing process of a semiconductor package related to a first embodiment of the present invention.

Next, a plating resist 14 is formed at a certain position above the resin 40 (see FIG. 9). The plating resist 14 may be formed using an exposure/development method.

Next, Cu is filled plated using a plating method after forming a see film in the opening 41 and opening 42 using a sputtering method. Furthermore, Cu is field plated using a plating method above the opening 41 plated with Cu and the resin 40 in the periphery thereof to form the second wiring 70. Similarly, the wiring 80 is formed above the opening 42 plated with Cu and the resin 40 in the periphery part thereof (see FIG. 10). It is clear that the plating resist 14 is arranged so that the second wiring 70 and wiring 80 do not contact.

Figure 11:
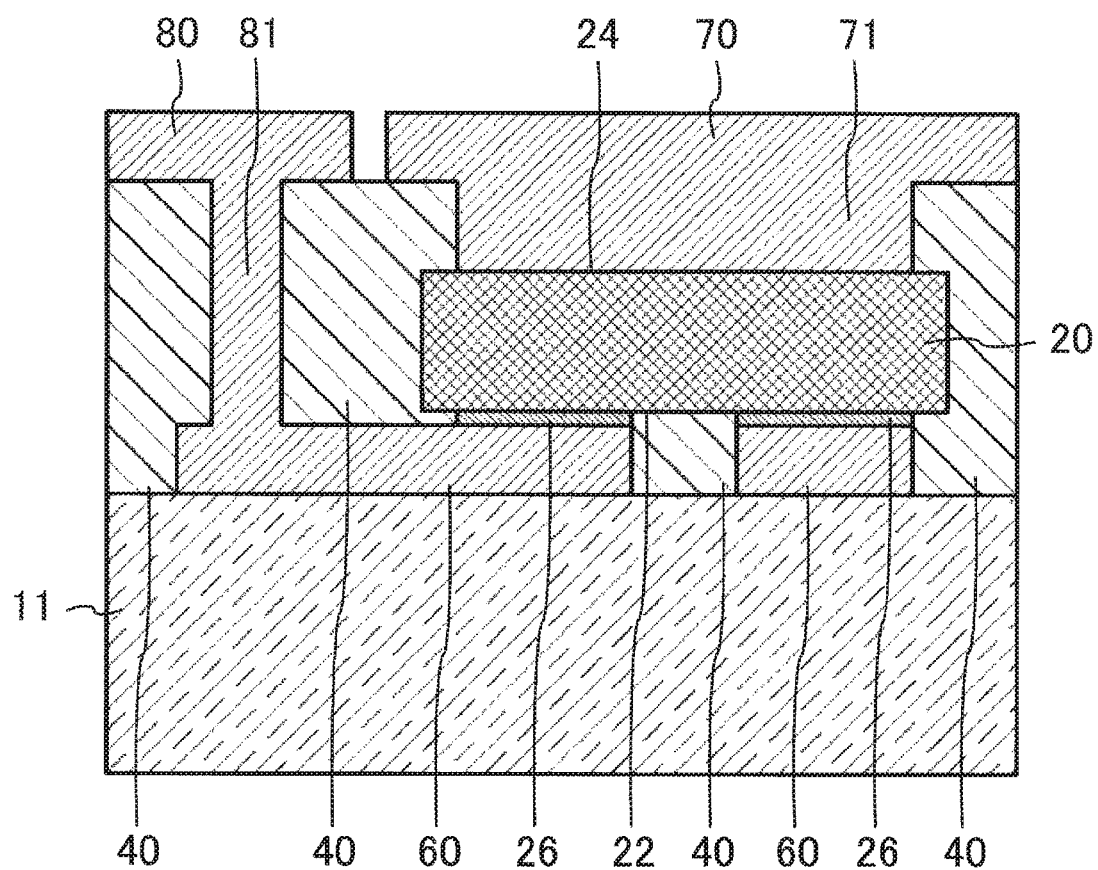
FIG. 11 is a cross-sectional diagram showing a manufacturing process of a semiconductor package related to a first embodiment of the present invention.

Next, the plating resist 14 is stripped and removed (see FIG. 11). In addition, the seed film is removed by an etching method.

Figure 12:
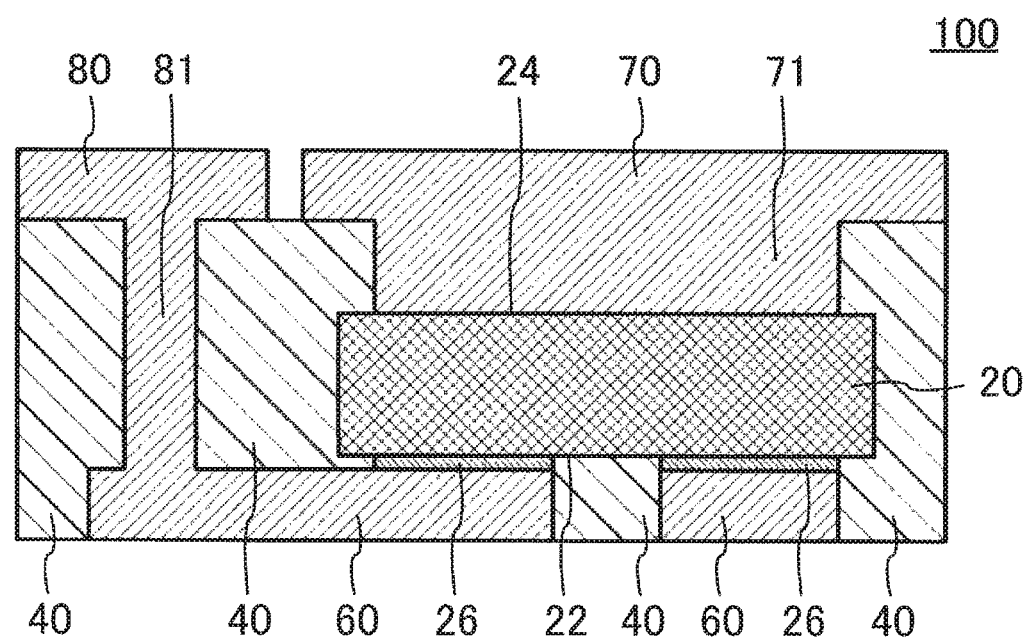
FIG. 12 is a cross-sectional diagram of a semiconductor package related to a first embodiment of the present invention.

Lastly, the support plate 11 is removed by an etching method and the semiconductor package 100 is complete (see FIG. 12).

The semiconductor package 100 related to the first embodiment of the present invention is formed by direct metallization of the second wiring 70 to the rear surface of the semiconductor chip 20 via an opening 41 having a large diameter. By adopting this type of structure, it is possible to reduce thermal resistance from the rear surface of the semiconductor chip 20 to the second wiring 70 formed on the surface of the semiconductor package 100. In addition, it is possible realize low cost since a TIM material used in conventional technologies is not necessary.

Second Embodiment

Next, a semiconductor package and a manufacturing method thereof related to a second embodiment are explained. Furthermore, the entire structure of the semiconductor package is the same as FIG. 1 explained in the first embodiment.

—Manufacturing Method of a Semiconductor Package Related to the Second Embodiment—

FIG. 13 to FIG. 25 show the sequence of a manufacturing process of the semiconductor package 200 related to the second embodiment of the present invention and show cross-sections along the line I-I' in FIG. 1.

Figure 13:
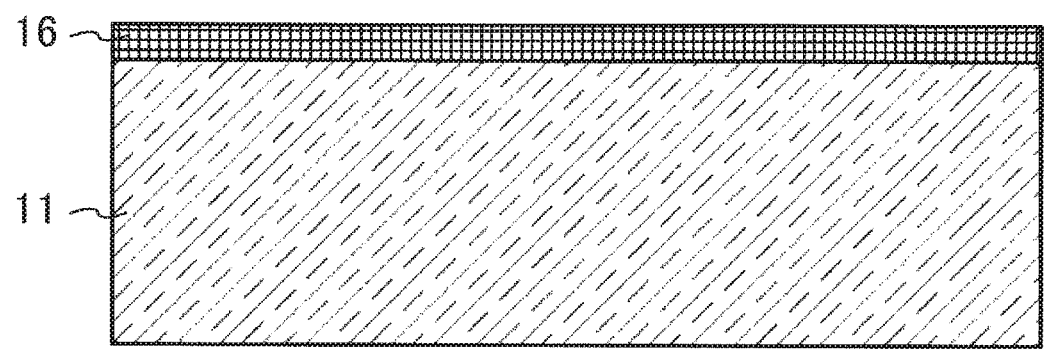
FIG. 13 is a cross-sectional diagram showing a manufacturing process of a semiconductor package related to a second embodiment of the present invention.

FIG. 13 shows a state whereby a temporary fixing member 16 is formed above the support plate 11. It is possible to favorably used Cu and the like which has excellent etching properties as the support plate 11. In addition, the temporary fixing member 16 is formed in order to temporarily fix the semiconductor chip 20 in the manufacturing process of the second embodiment and is formed from resin for example.

Figure 14:
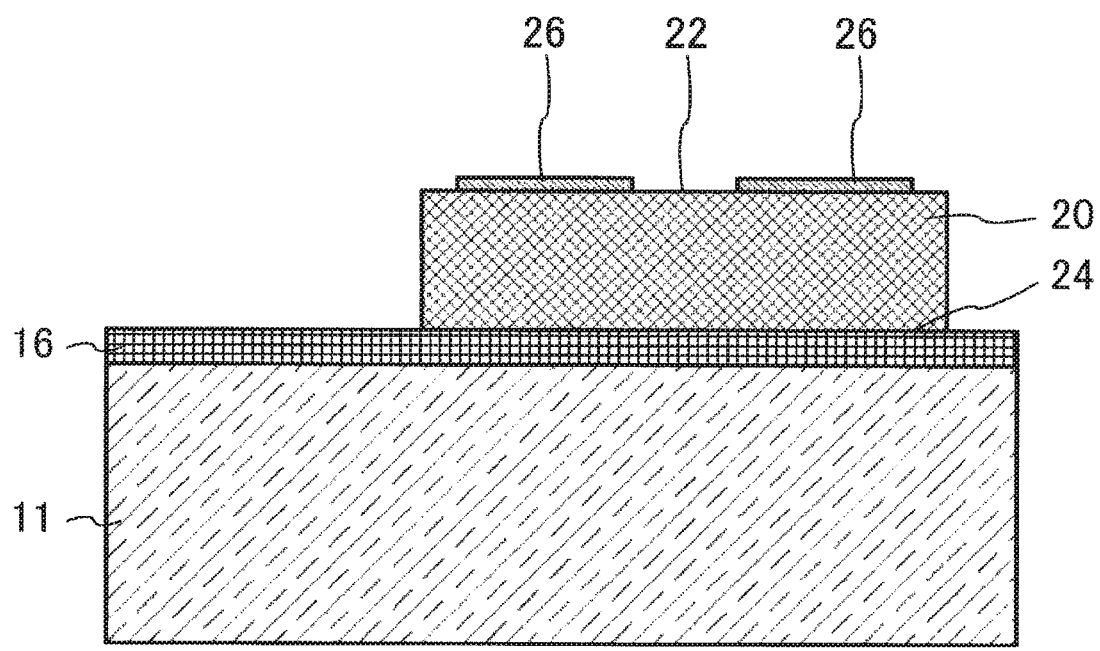
FIG. 14 is a cross-sectional diagram showing a manufacturing process of a semiconductor package related to a second embodiment of the present invention.

Next, the rear surface 24 of the semiconductor chip 20 is arranged above the temporary fixing member 16 so as to contact the temporary fixing member 16 (see FIG. 14). That is, the semiconductor chip 20 is arranged above the temporary fixing member 16 so that the element surface 22 arranged with the electrode 26 of the semiconductor chip 20 faces upwards.

Figure 15:
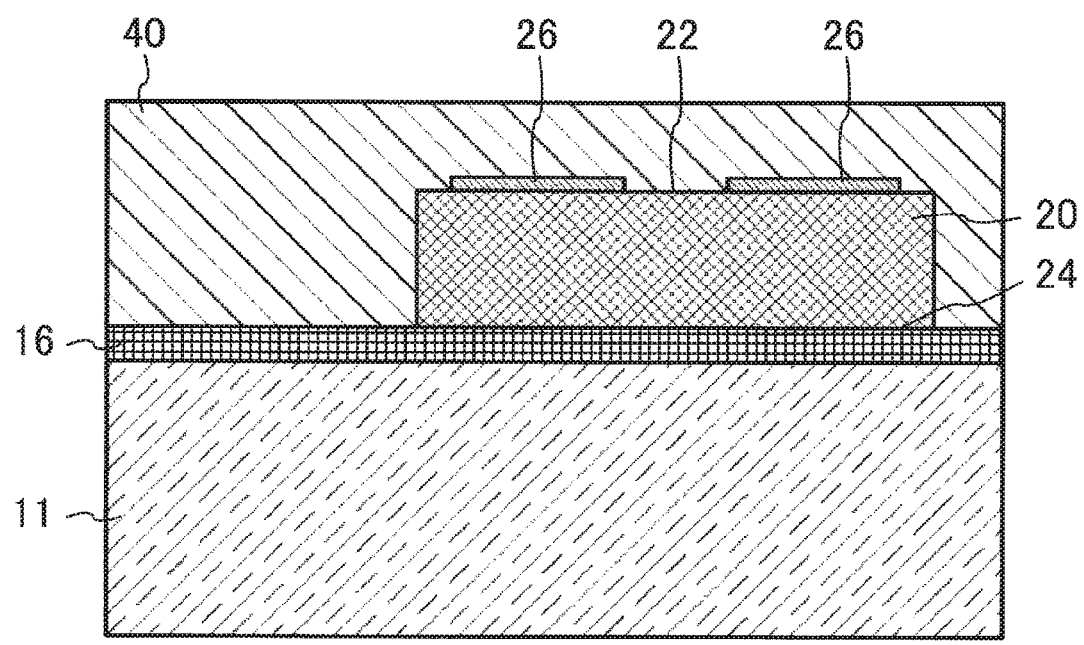
FIG. 15 is a cross-sectional diagram showing a manufacturing process of a semiconductor package related to a second embodiment of the present invention.

Next, the resin 40 is filled above the temporary fixing member 16 and semiconductor chip 20 so that the element surface 22 and side surface of the semiconductor chip 20 are sealed (see FIG. 15).

Figure 16:
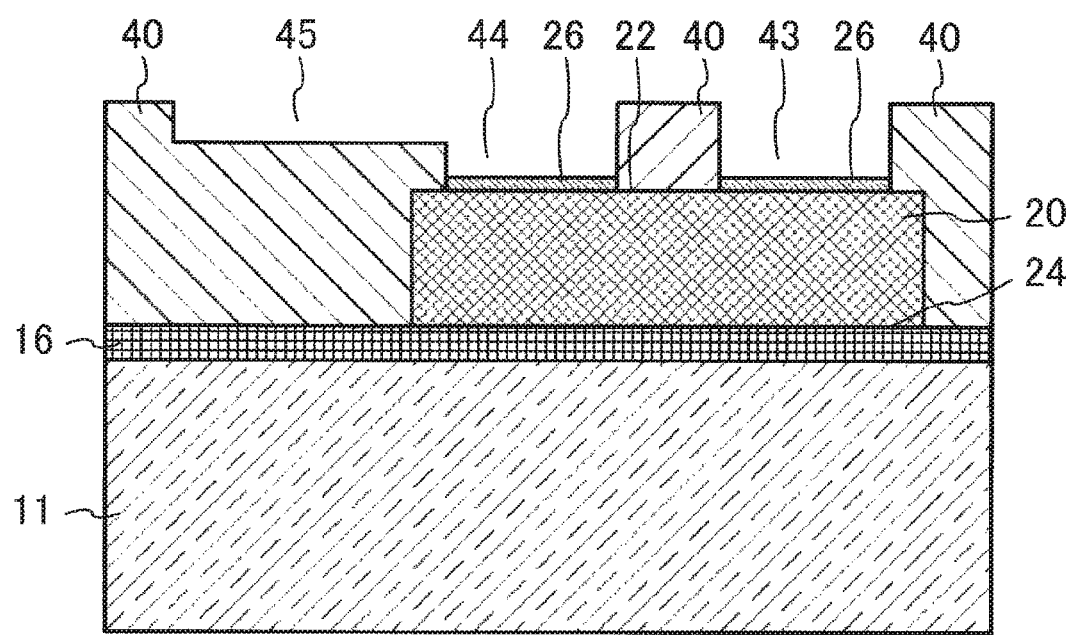
FIG. 16 is a cross-sectional diagram showing a manufacturing process of a semiconductor package related to a second embodiment of the present invention.
Figure 17:
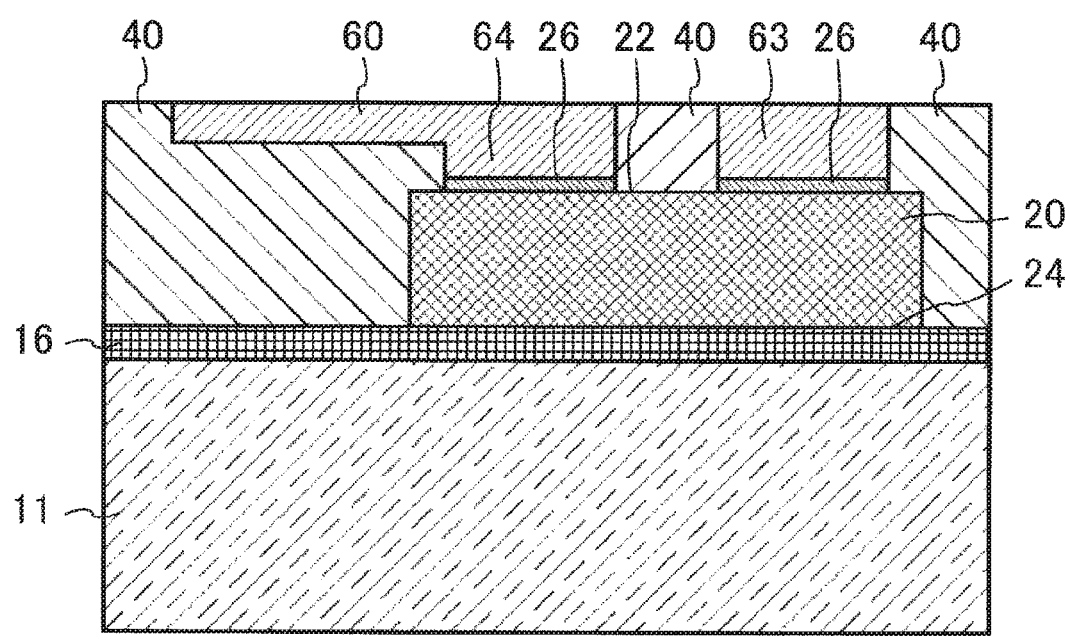
FIG. 17 is a cross-sectional diagram showing a manufacturing process of a semiconductor package related to a second embodiment of the present invention.

Next, openings 43, 44 and 45 are formed in the resin 40 (see FIG. 16). Here, the openings 43 and 44 are formed so as to expose the electrode 26 of the semiconductor chip 20. However, these openings 43, 44 are not always formed so as to expose just an electrode 26 but may also be formed so as to expose the surface of the semiconductor chip 20 which is not arranged with the electrode 26. In addition, the opening 45 is formed to a depth in a range from the surface on the upper side of the resin 40 to a position arranged with the electrode 26 of the semiconductor chip 20 and one part is in common with the opening 44. That is, as a manufacturing process of the openings 45 and 44, the opening 45 may be formed first and next the opening 44 may be formed at a certain position which exposes the electrode 26 using a part of the opening 45.

Next, Cu is field plated on the openings 43, 44 and 45 using a plating method. A via 63 of the opening 43, a via 64 of the opening 44 and the first wiring 60 of the opening 45 are formed respectively (see FIG. 17).

Figure 18:
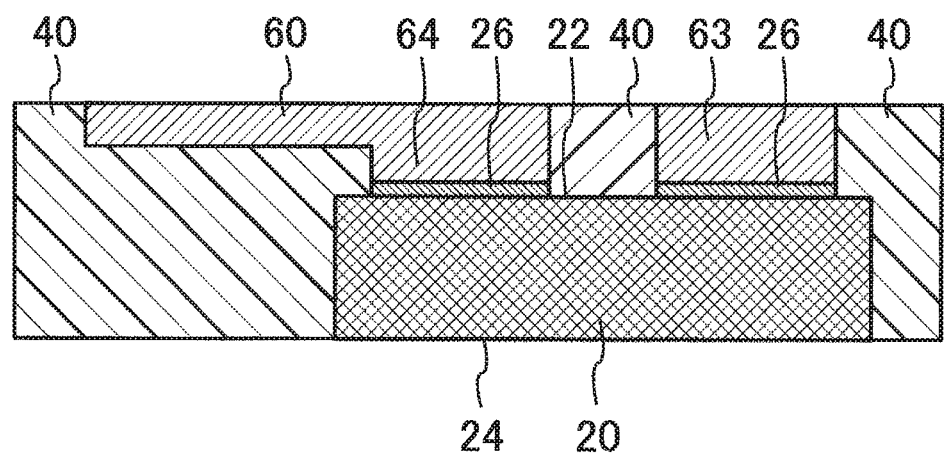
FIG. 18 is a cross-sectional diagram showing a manufacturing process of a semiconductor package related to a second embodiment of the present invention.

Next, the support plate 11 and the temporary fixing member 16 are removed (see FIG. 18).

Figure 19:
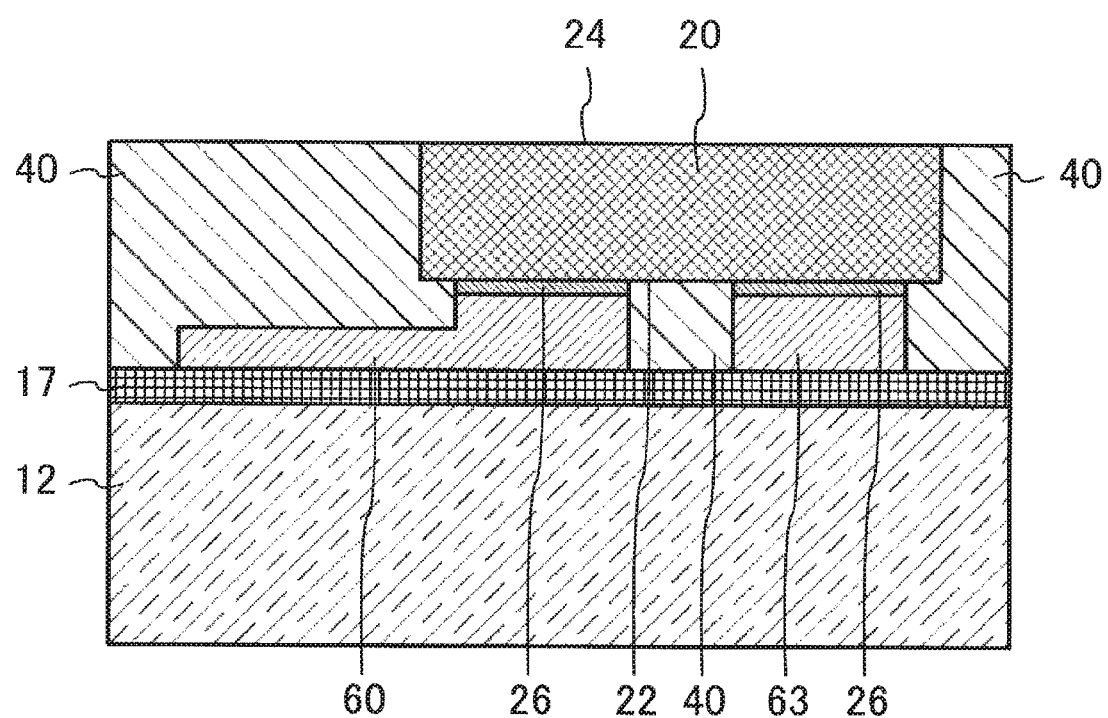
FIG. 19 is a cross-sectional diagram showing a manufacturing process of a semiconductor package related to a second embodiment of the present invention.

Next, a structured body including the semiconductor chip 20, resin 40 and first wiring 60 shown in FIG. 18 is vertically reversed and mounted above a support plate 12 formed with a fixing member 17 on an upper surface (see FIG. 19). That is, the structured body is mounted so that the fixing member 17 contacts with a surface formed with the first wiring 60 and the rear surface 24 of the semiconductor chip 20 is located on an upper side.

Figure 20:
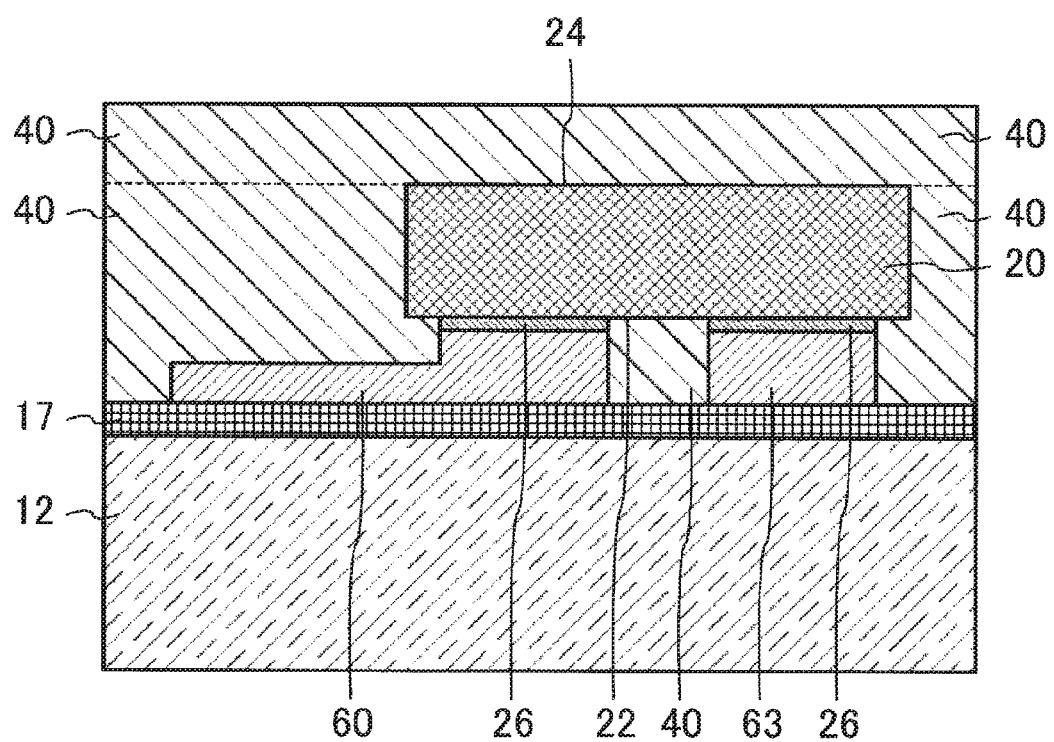
FIG. 20 is a cross-sectional diagram showing a manufacturing process of a semiconductor package related to a second embodiment of the present invention.

Next, resin is further filled on the upper side of the rear surface 24 of the semiconductor chip 20 and the resin 40 (see FIG. 20). Herein, the resin 40 which has already been formed and the resin filled in the present process are explained collectively as the resin 40.

Figure 21:
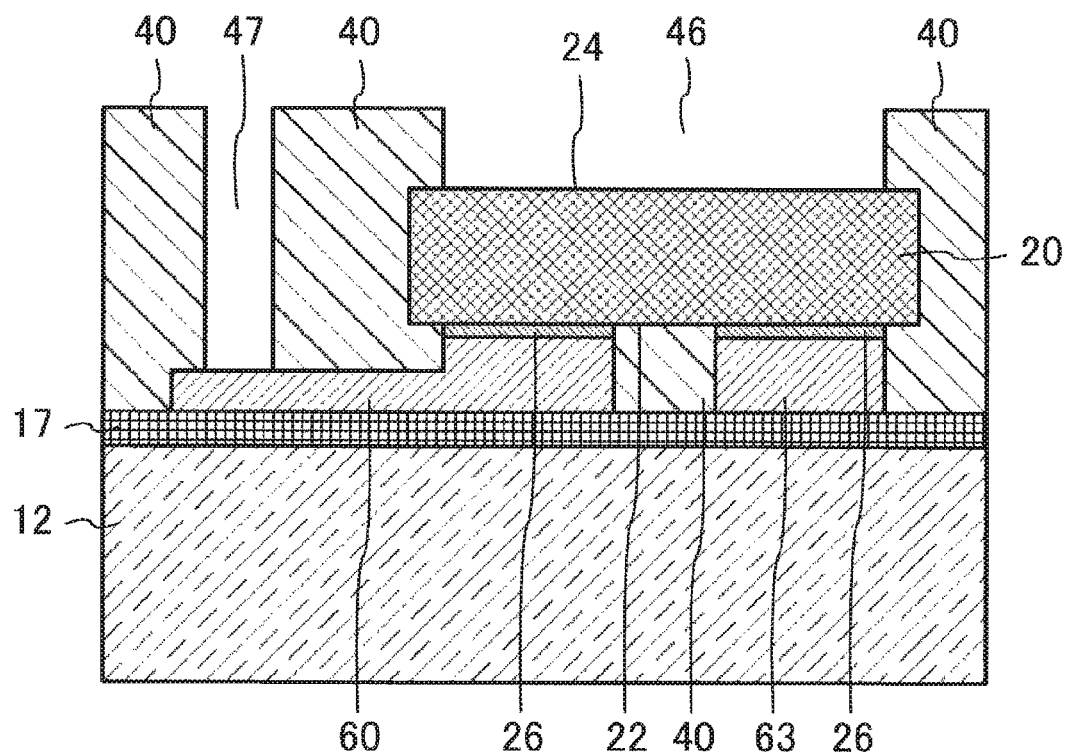
FIG. 21 is a cross-sectional diagram showing a manufacturing process of a semiconductor package related to a second embodiment of the present invention.

Next, openings 46 and 47 are formed in the resin 40 (see FIG. 21). The opening 46 is formed in a certain position so as to expose the rear surface 24 of the semiconductor chip 20 and the opening 47 is formed in a certain position so as to expose the first wiring 60. The opening 46 which exposes the rear surface 24 of the semiconductor chip 20 may also have a rectangular shaped comparatively large diameter matching the shape of the semiconductor chip 20.

Figure 22:
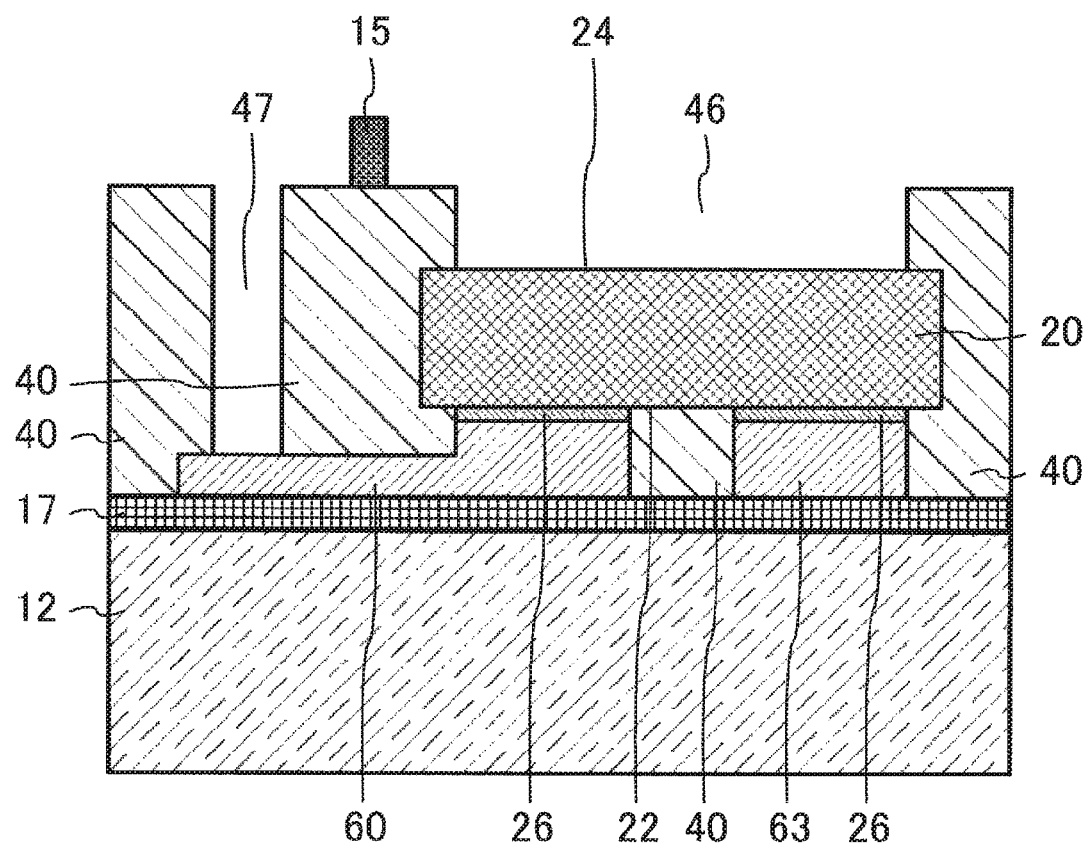
FIG. 22 is a cross-sectional diagram showing a manufacturing process of a semiconductor package related to a second embodiment of the present invention.
Figure 23:
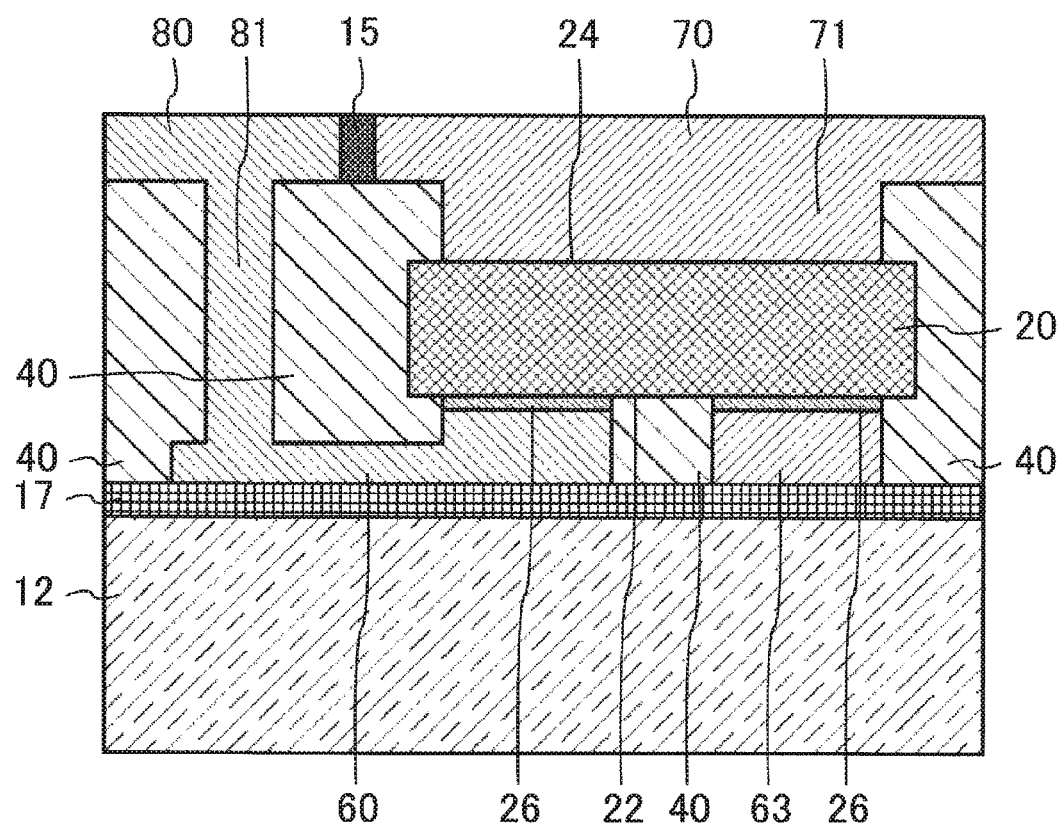
FIG. 23 is a cross-sectional diagram showing a manufacturing process of a semiconductor package related to a second embodiment of the present invention.

Next, the plating resist 15 is formed in a certain position above the resin 40 (see FIG. 22).

Next, Cu is field plated on the openings 46 and 47 using a plating method and via 71 and via 81 are formed. Furthermore, Cu is field plated above the via 71 and the resin 40 in the periphery thereof using a plating method to form a second wiring 70. Similarly, wiring 80 is formed above the via 81 and the resin 40 in the periphery thereof (see FIG. 23). It is clear that the plating resist 15 is arranged so that the second wiring 70 and wiring 80 do not contact.

Figure 24:
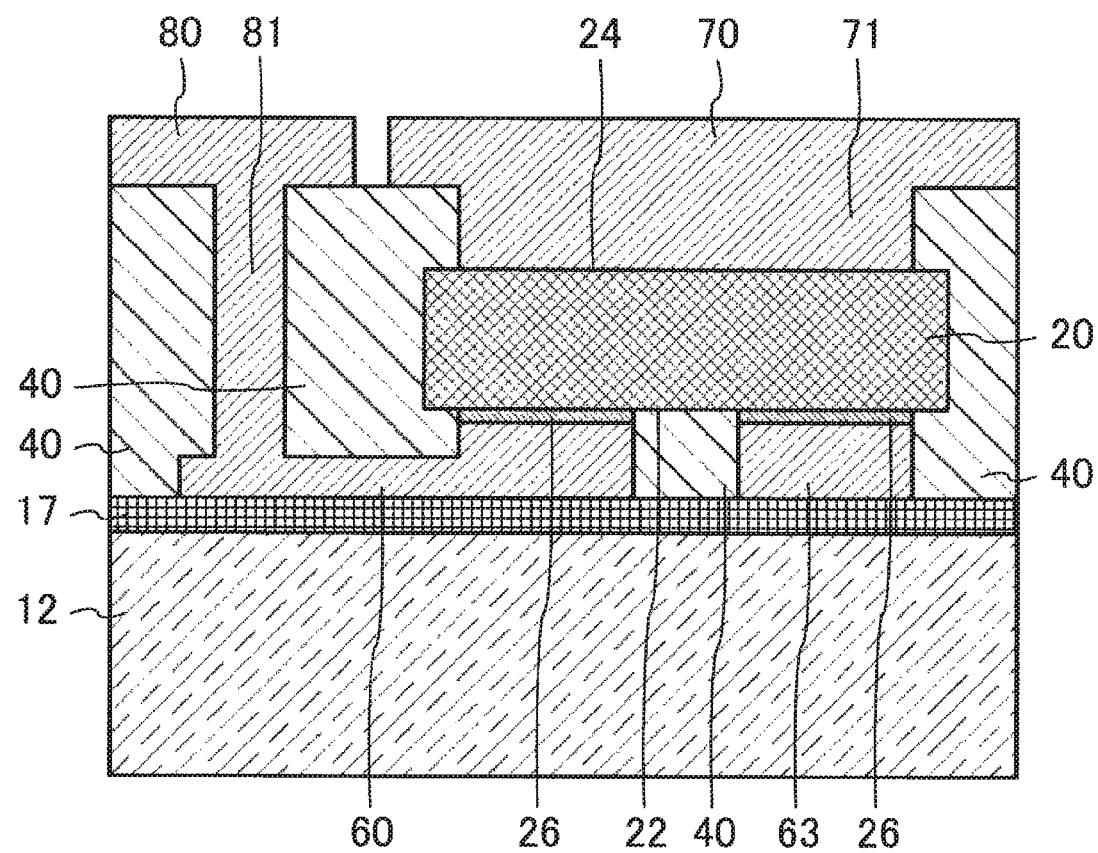
FIG. 24 is a cross-sectional diagram showing a manufacturing process of a semiconductor package related to a second embodiment of the present invention.

Next, the plating resist 15 is stripped and removed (see FIG. 24). In addition, the seed film is removed by an etching method.

Figure 25:
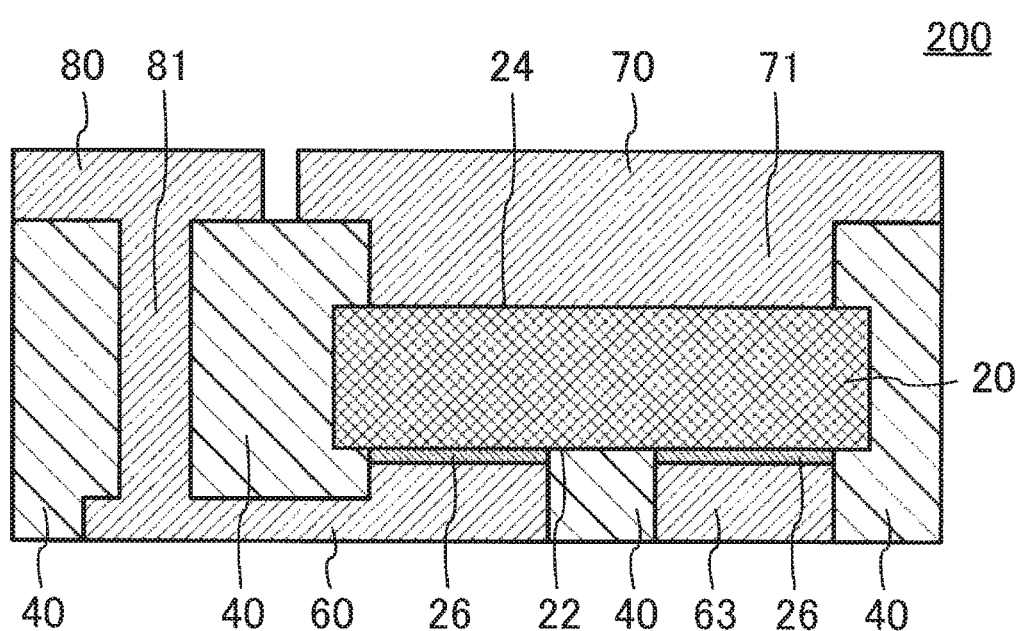
FIG. 25 is a cross-sectional diagram of a semiconductor package related to a second embodiment of the present invention.

Lastly, the support plate 12 and the fixing member 17 are removed and the semiconductor package 200 is complete (see FIG. 25).

The semiconductor package 200 related to the second embodiment of the present invention is also formed by direct metallization of the second wiring 70 to the rear surface 24 of the semiconductor chip 20 via the opening 41 having a large diameter. By adopting this type of structure, it is possible to reduce thermal resistance from the rear surface 24 of the semiconductor chip 20 to the second wiring 70 formed in the rear surface of the semiconductor package 200. In addition, it is possible to realize low cost since a TIM material used in conventional technologies is not necessary.

According to the second embodiment of the present invention, by forming the electrode 26 of the semiconductor chip 20 and the first wiring 60 using a via 63, 64 by a plating method, since growth of an intermetallic compound is produced between a solder and electrode or via due to a high temperature environment compared with the case of a flip flop connection using a general solder material as the bonding material, it is possible to realize a semiconductor package 200 with a high level of reliability. Furthermore, by filing plating into an opening arranged in a part where an electrode of a semiconductor chip is not arranged, cooling is possible from both surfaces of the semiconductor package 200 and it is possible to realize a low thermal resistance semiconductor package 200.

Modified Example

In the first embodiment and second embodiment, the opening 41 or 46 are formed with rectangular comparatively large diameter matching the shape of the semiconductor chip 20 in the resin 40 and the via 71 is formed by a plating method. Here, since it is possible to easily realize split patterning of a metal by patterning using photolithography, it is possible to easily form split patterning shown below.

Figure 26A:
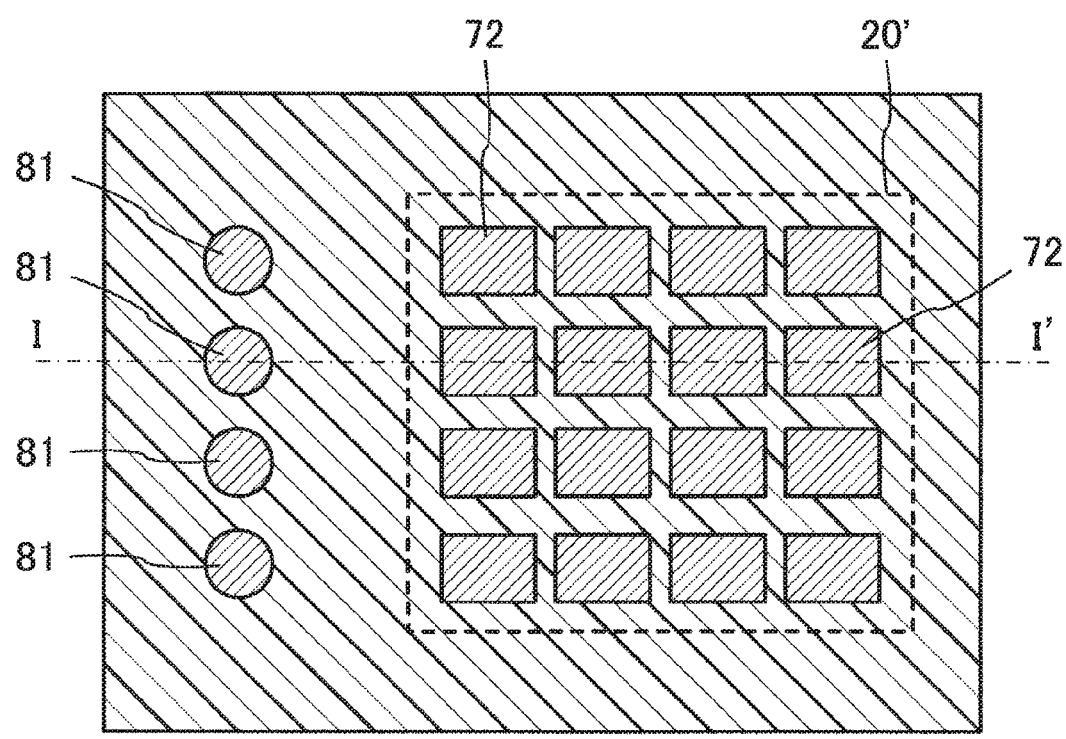
FIG. 26A is a horizontal cross-sectional diagram showing a modified example 1 of a semiconductor package related to a first embodiment and second embodiment of the present invention.
Figure 26B:
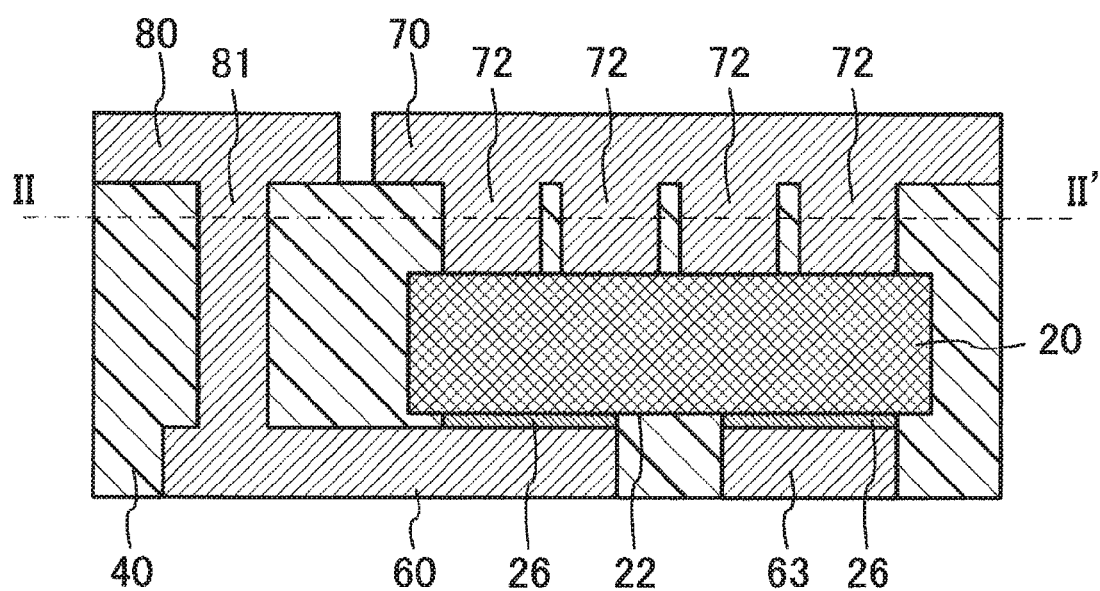
FIG. 26B is a perpendicular cross-sectional diagram showing a modified example 1 of a semiconductor package related to a first embodiment and second embodiment of the present invention.

FIG. 26A and FIG. 26B are diagrams showing a modified example 1 of a semiconductor package related to the first embodiment or second embodiment of the present invention. FIG. 26B shows a perpendicular cross section of a semiconductor package. In addition, FIG. 26B shows a horizontal cross section along the line II-II' in FIG. 26A. Furthermore, the region enclosed by the dotted line 20' indicates an area arranged with the semiconductor chip 20.

When the modified example 1 is compared with the first and second embodiment, the process for forming the opening 41 in the first embodiment shown in FIG. 9 and the process for forming the opening 46 in the second embodiment shown in FIG. 21 are different. In the modified example 1, 4×4 comparatively small rectangular shaped openings are formed on a planar surface. Cu is filled into these openings using a plating method to form the via 72. After forming the via 72, the second wiring 70 is formed above the via 72 and the resin 40 in the periphery thereof the same as in the first and second embodiments.

Figure 27A:
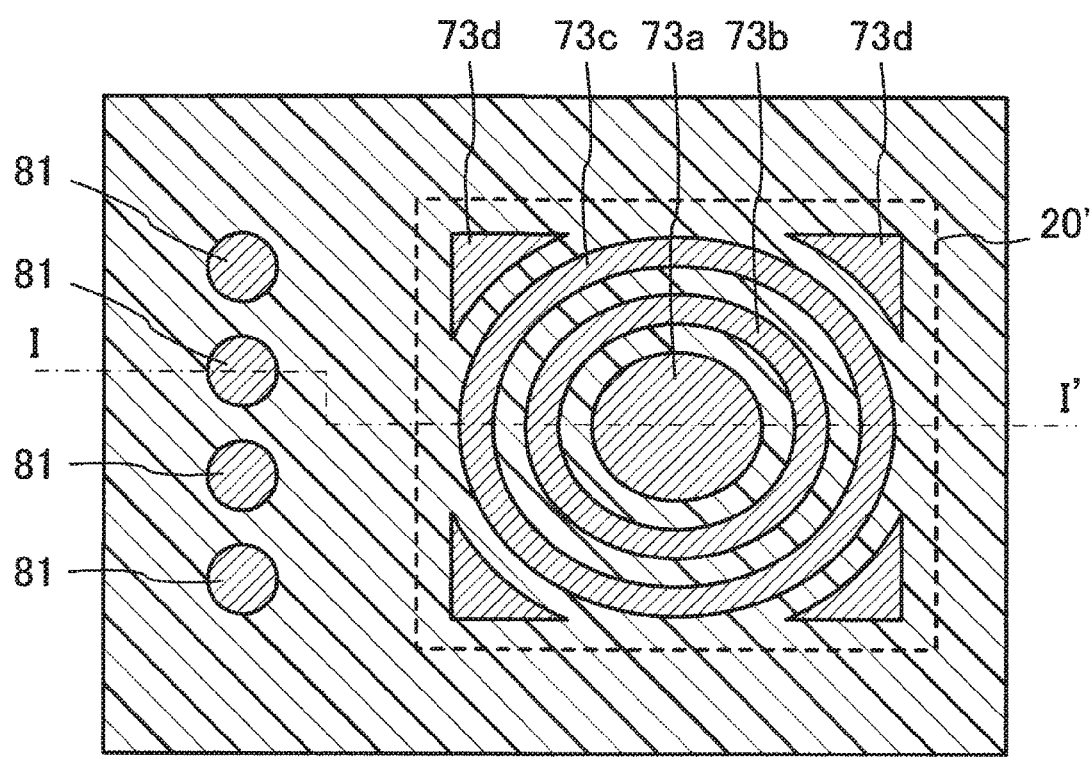
FIG. 27A is a horizontal cross-sectional diagram showing a modified example 2 of a semiconductor package related to a first embodiment and second embodiment of the present invention.
Figure 27B:
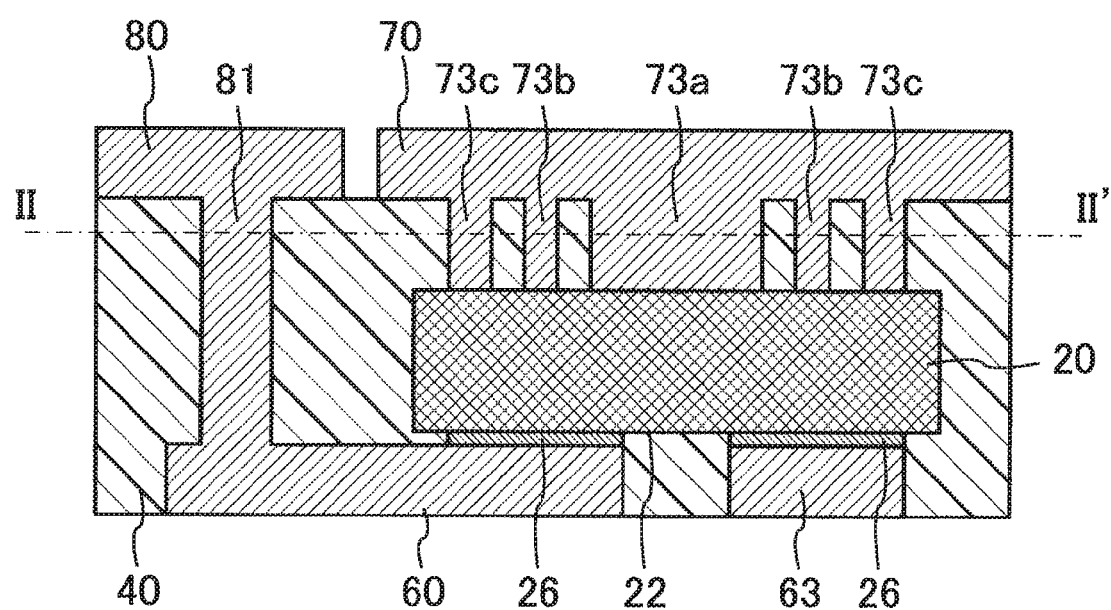
FIG. 27B is a perpendicular cross-sectional diagram showing a modified example 2 of a semiconductor package related to a first embodiment and second embodiment of the present invention.

FIG. 27A and FIG. 27B are diagrams showing a modified example 2 of a semiconductor package related to the first embodiment or second embodiment of the present invention. FIG. 27B shows a perpendicular cross section of a semiconductor package. In addition, FIG. 27A shows a horizontal cross section along the line II-II' in FIG. 27B. In the modified example 2, a circular via 73a, ring shaped via 73b, 73c and a via 73d having a partial ring shape which spread out concentrically from a center position of the semiconductor chip 20 above a planar surface are formed respectively. The processes after formation of the via 73a to 73d are the same as the modified example 1.

Figure 28A:
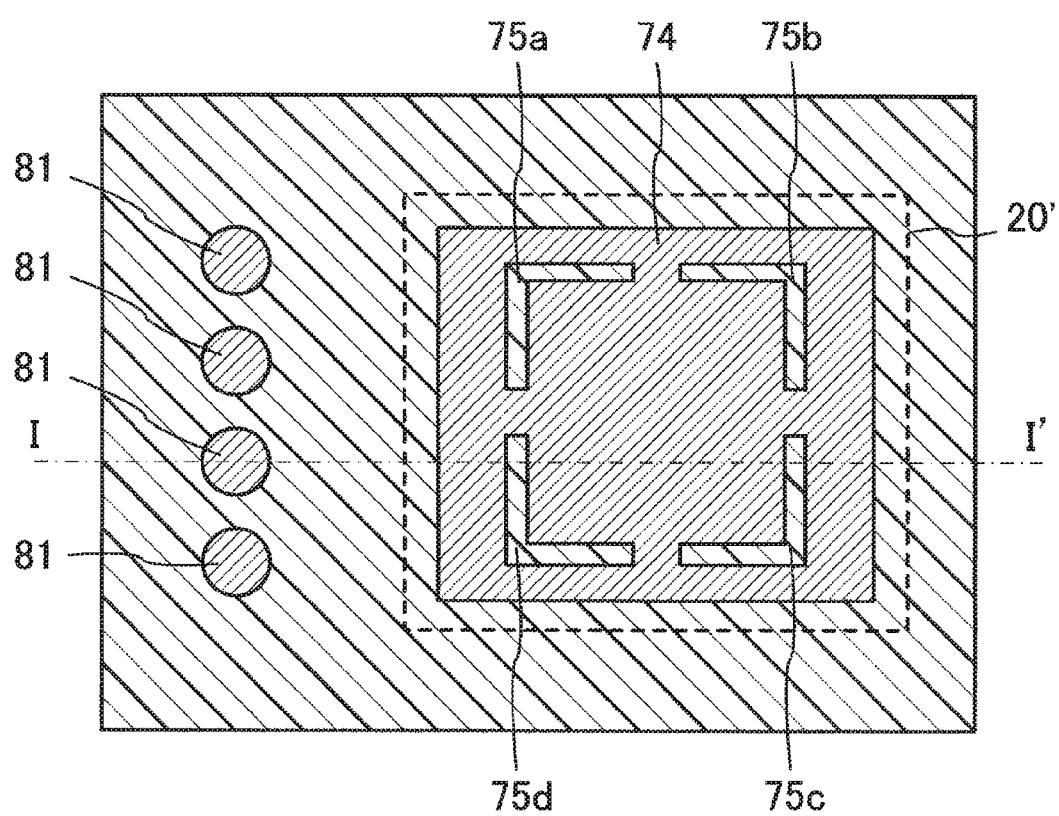
FIG. 28A is a horizontal cross-sectional diagram showing a modified example 3 of a semiconductor package related to a first embodiment and second embodiment of the present invention.
Figure 28B:
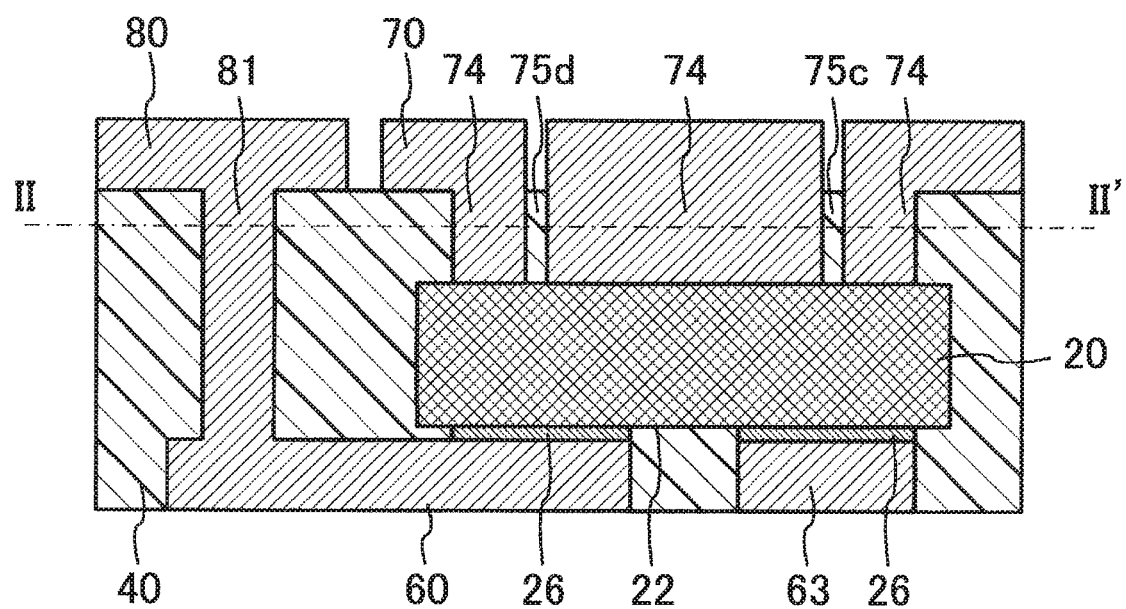
FIG. 28B is a perpendicular cross-sectional diagram showing a modified example 3 of a semiconductor package related to a first embodiment and second embodiment of the present invention.

FIG. 28A and FIG. 28B are diagrams showing a modified example 3 of a semiconductor package related to the first embodiment or second embodiment of the present invention. FIG. 28B shows a perpendicular cross section of a semiconductor package. In addition, FIG. 28A shows a horizontal cross section along the line II-II' in FIG. 28B. In the modified example 3, although the via 74 is formed in a rectangular shape matching the shape of the semiconductor chip 20 the same as in the first embodiment and second embodiment, non via forming parts 75a, 75b, 75c and 75d in which a via is not formed are included on the inner side of the via 74 above a planar surface. The non via forming parts 75a, to 75d have a L character shape and are each formed in a direction rotated 90 degrees respectively. In addition, the non via forming parts 75a to 75d are each arranged so that a quadrangle is shown in each corner respectively.

In the modified example 1 and modified example 2, it is possible to form the via 72, 73a, 73b, 73c and 73d connecting the rear surface 24 of the semiconductor chip 20 and the second wiring 70 in a desired shape on a planar surface. In other words, it is possible to form not just the via 72, 73a, 73b, 73c and 73d between the semiconductor chip 20 and the second wiring 70 but also form the via 72, 73a, 73b, 73c and 73d interposing the resin 40 at a desired position. By adopting such as a structure, the modified example 1 and modified example 2 can improve the effects of dispersing stress caused by a thermal expansion coefficient difference between the semiconductor chip 20 and the second wiring 70 compared to the first embodiment and the second embodiment.

The second wiring 70 is not formed above the non via forming parts 75a to 75d in the modified example 3. That is, in the modified example 3, a plating resist is formed above the non via forming parts 75a to 75d after the via 74 is formed. In addition, the plating resist is removed after the second wiring 70 is formed.

Figure 29A:
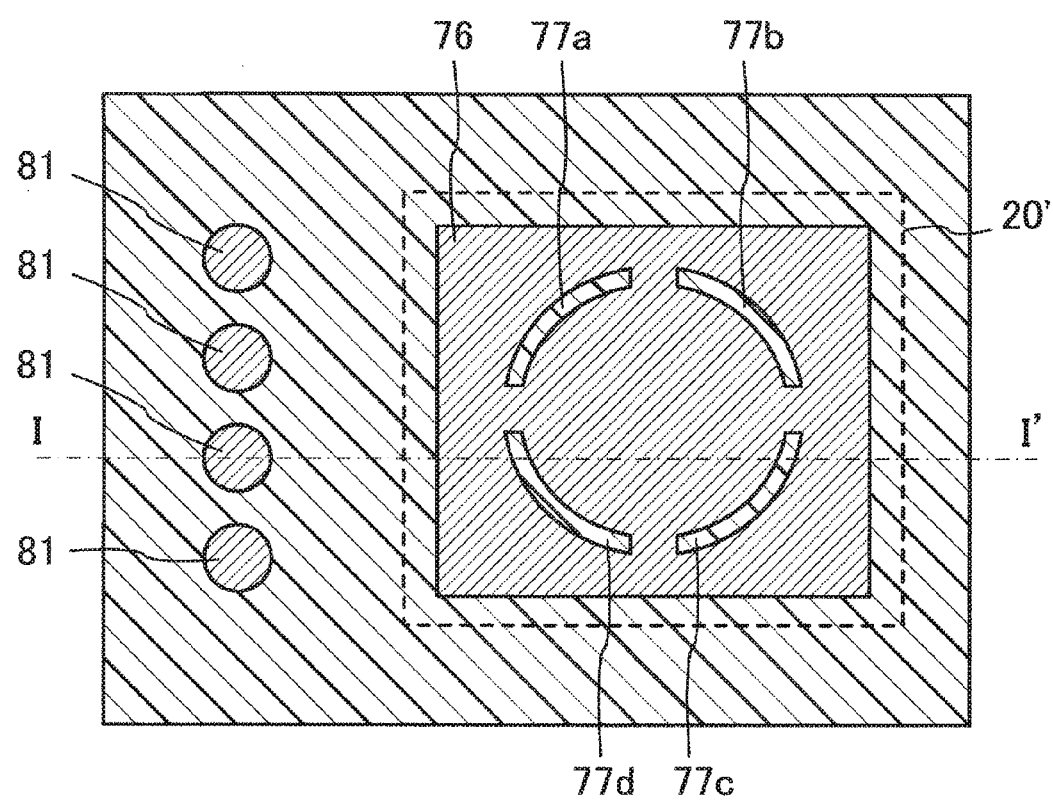
FIG. 29A is a horizontal cross-sectional diagram showing a modified example 4 of a semiconductor package related to a first embodiment and second embodiment of the present invention.
Figure 29B:
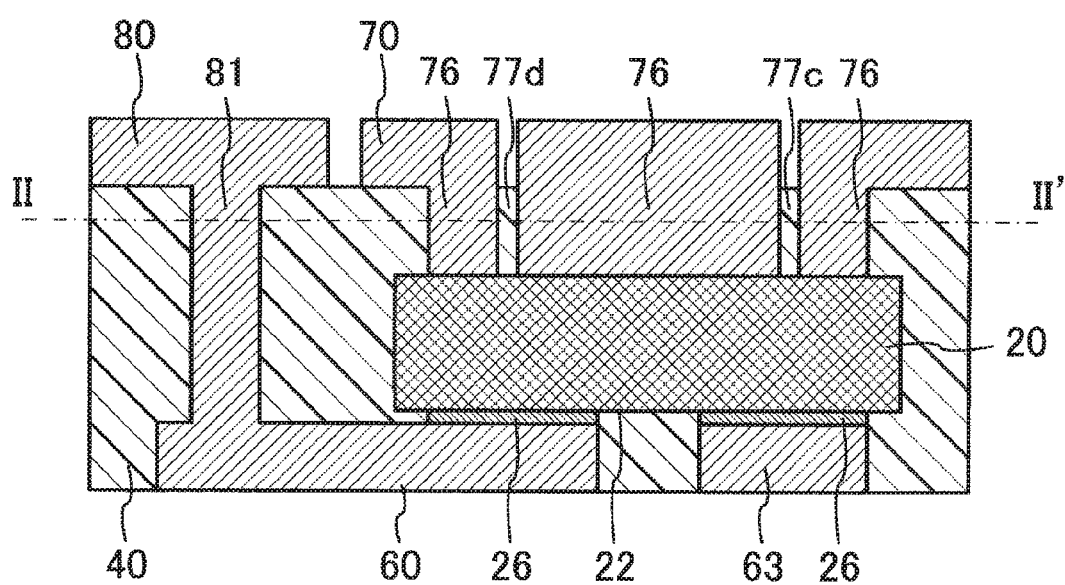
FIG. 29B is a perpendicular cross-sectional diagram showing a modified example 4 of a semiconductor package related to a first embodiment and second embodiment of the present invention.

FIG. 29A and FIG. 29B are diagrams showing a modified example 4 of a semiconductor package related to the first embodiment or second embodiment of the present invention. FIG. 29B shows a perpendicular cross section of a semiconductor package. In addition, FIG. 29A shows a horizontal cross section along the line II-II' in FIG. 29B. In the modified example 4, although the via 76 is formed in a rectangular shape matching the shape of the semiconductor chip 20 the same as in the first embodiment and second embodiment, non via forming parts 77a, 77b, 77c and 77d are formed the same as in the modified example 3. The non via forming parts 77a to 77d have an arc shape. Each of the non via forming parts 77a to 77d is arranged respectively so that one circle is shown by the non via forming parts 77a to 77d.

In the modified example 3 and modified example 4, unlike the modified example 1 and modified example 2, it is possible not to form the second wiring 70 on an upper part of a non via forming part 75a, 75b, 75c, 77a, 77b, 77c and 77d in a perpendicular planar surface. By adopting this type of structure, it is possible to further improve the effects of dispersing stress caused by a thermal expansion coefficient difference between the semiconductor chip 20 and the second wiring 70.

Third Embodiment

The structure of a semiconductor package and a manufacturing method thereof is explained using FIG. 30 to FIG. 33.

Figure 30:
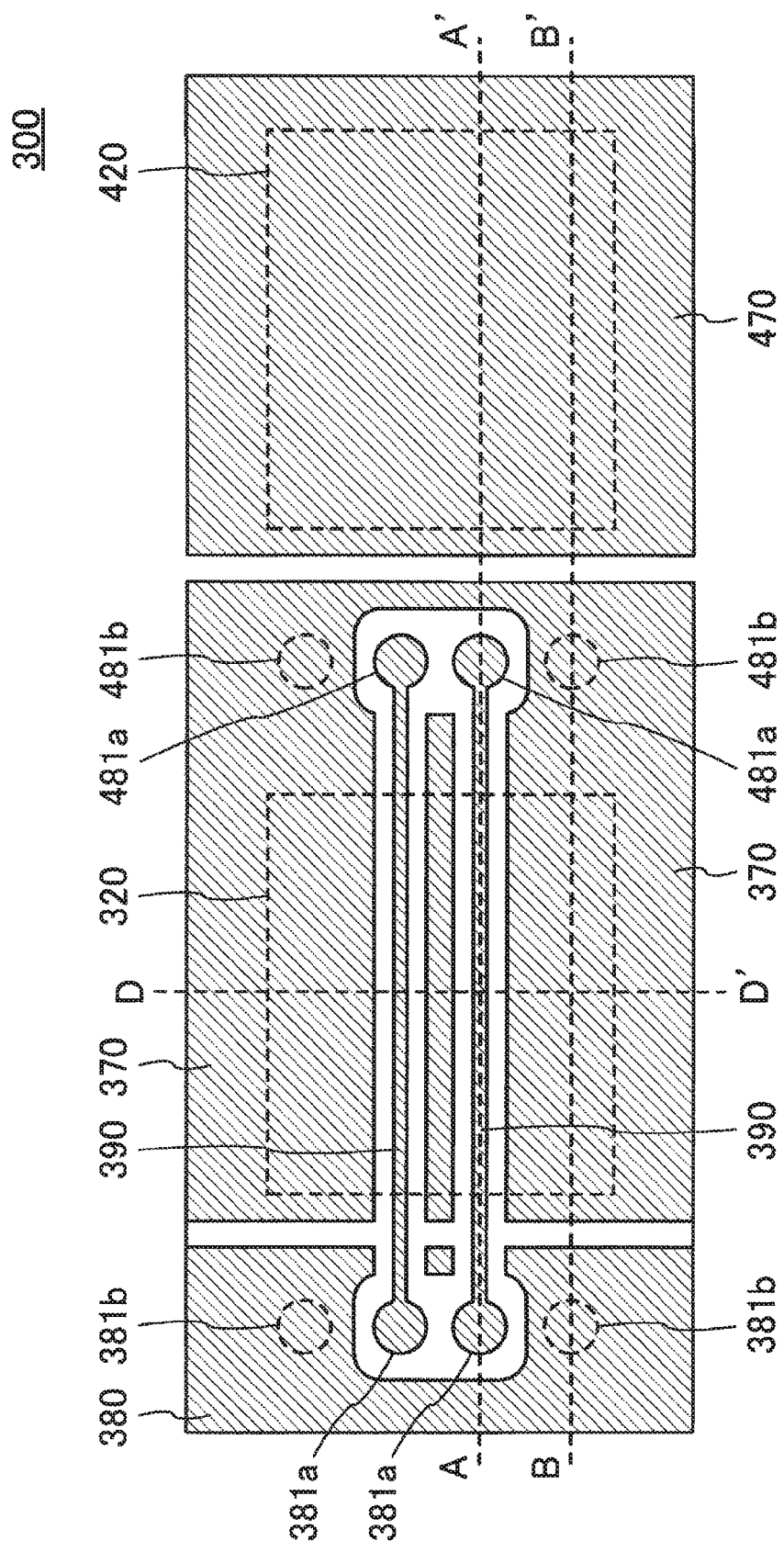
FIG. 30 is a horizontal cross-sectional diagram of a semiconductor package related to a third embodiment of the present invention.
Figure 31:
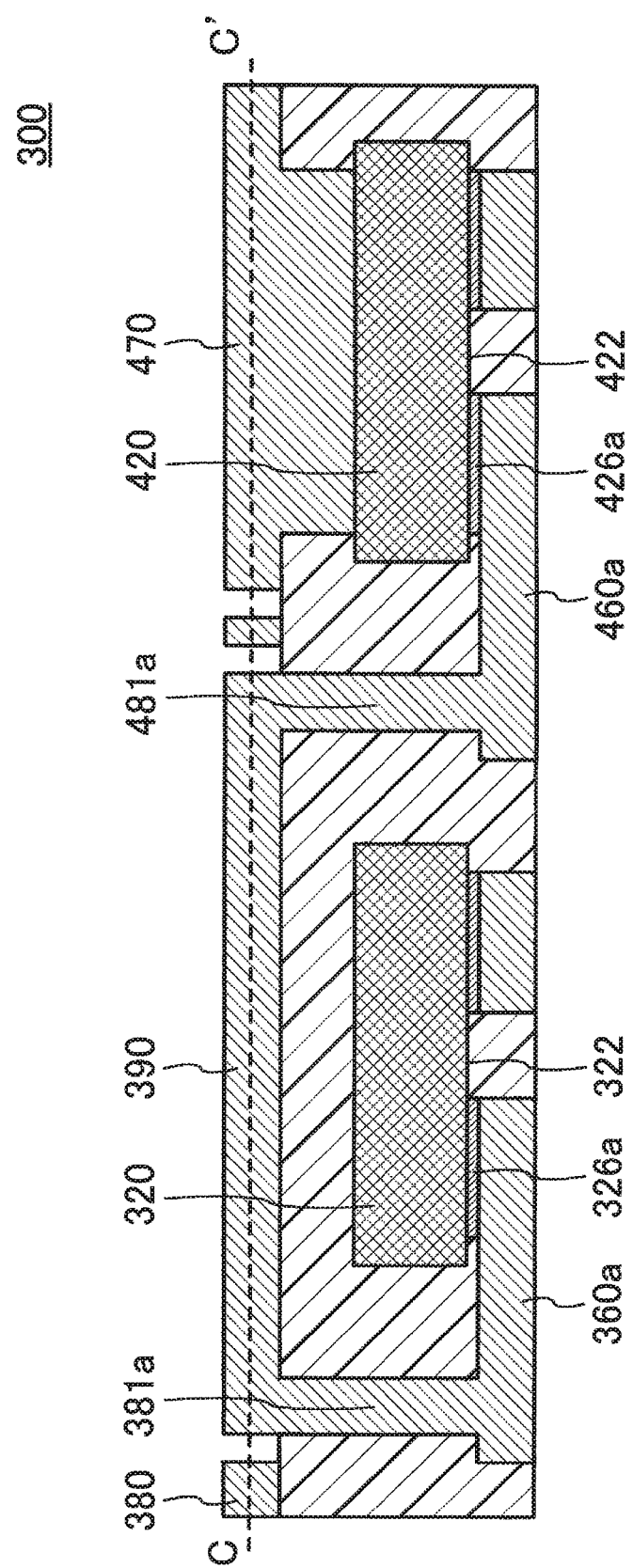
FIG. 31 is a perpendicular cross-sectional diagram of a semiconductor package related to a third embodiment of the present invention.
Figure 32:
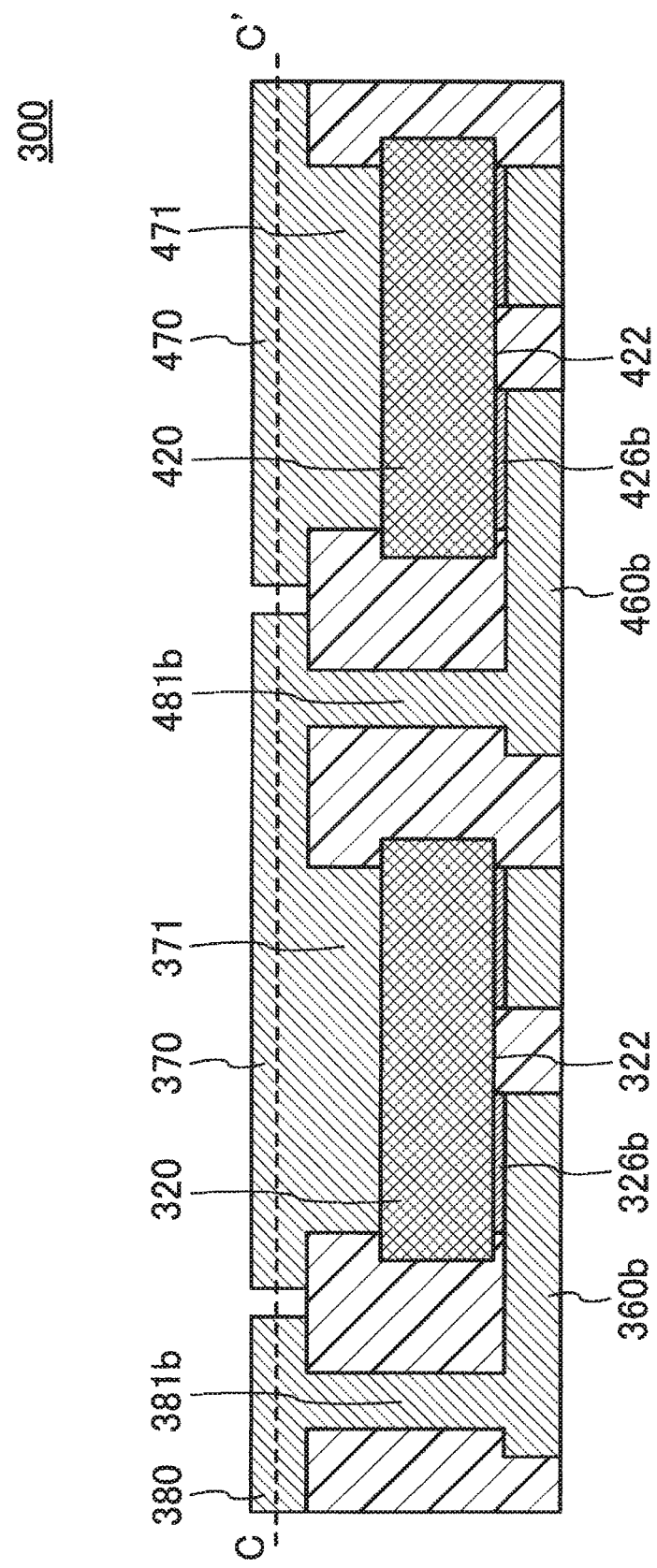
FIG. 32 is a perpendicular cross-sectional diagram of a semiconductor package related to a third embodiment of the present invention.
Figure 33:
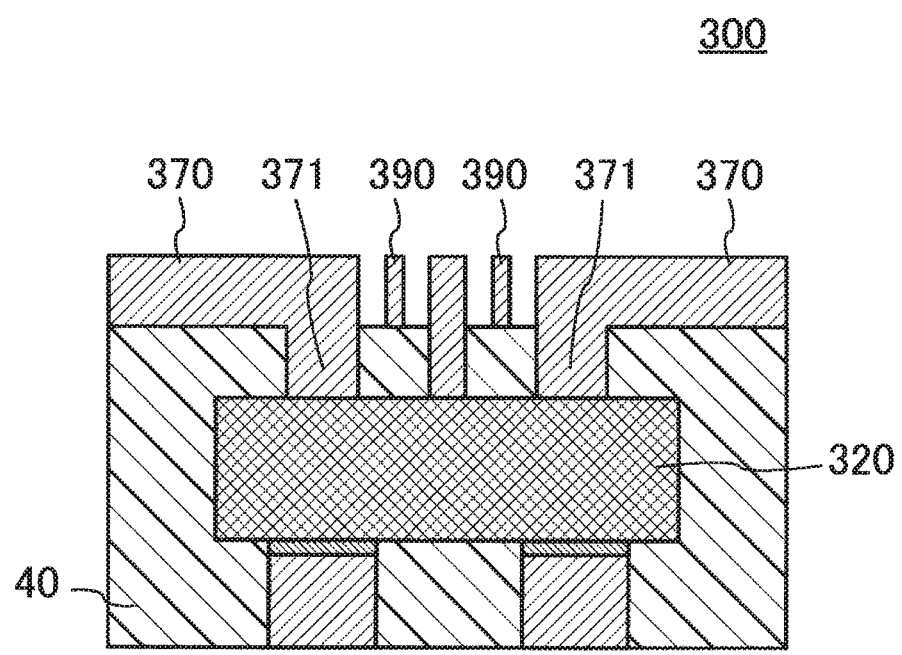
FIG. 33 is a perpendicular cross-sectional diagram of a semiconductor package related to a third embodiment of the present invention.

FIG. 30 is a horizontal cross sectional diagram of a semiconductor package 300 relate to the third embodiment of the present embodiment and FIG. 31 to FIG. 33 are perpendicular cross sectional diagrams. FIG. 30 is a horizontal cross sectional diagram along the line C-C' in FIG. 31 and FIG. 32. FIG. 31 is a perpendicular cross sectional diagram along the line A-A' in FIG. 30. FIG. 32 is a perpendicular cross sectional diagram along the line B-B' in FIG. 30. In addition, FIG. 33 is a perpendicular cross sectional diagram along the line D-D' in FIG. 30.

When referring to FIG. 30 to FIG. 32 it can be seen that the semiconductor package 300 is arranged with two semiconductor chips, 320 and 420 aligned next to each other. The manufacturing method of the semiconductor package 300 is the same as the manufacturing method of the semiconductor package 100 related to the first embodiment or the manufacturing method of the semiconductor package 200 related to the second embodiment. However, although two semiconductor chips are arranged in the semiconductor package 300, the semiconductor package 300 of this embodiment is different to the first embodiment and the second embodiment. FIG. 31 and FIG. 32 shows two semiconductor chips. In addition, the semiconductor package 300 is also different in that the third wiring 390 is formed on the same layer as the second wiring 370, 470. Furthermore, by applying a photolithography technology, it is possible to form each wiring in the semiconductor package 300 to obtain the structure explained below.

The semiconductor package 300 includes via 381a, 381b, 481a and 481b. Furthermore, 381a, 381b, 481a and 481b in FIG. 30 each show location arranged with a via respectively. The via 381b connects the wiring 380 and the first wiring 360b. The first wiring 260b is electrically connected with the electrode 326b of the semiconductor chip 320. The via 481b connects the second wiring 370 and the first wiring 460b. The first wiring 460b is electrically connected with the electrode 426b of the semiconductor chip 420.

The via 381a connects the third wiring 390 with the first wiring 360a. The first wiring 360a is electrically connected with the electrode 326a of the semiconductor 320. The via 481a connects the third wiring 390 with the first wiring 460a. The first wiring 460a is electrically connected with the electrode 426a of the semiconductor chip 420. Furthermore, the third wiring 390 is formed on the same layer as the second wiring 370 and the wiring 380. In addition, as is clear when referring to FIG. 30 and FIG. 33, the third wiring 390 is not electrically connected with the second wiring 370 and the wiring 380.

The electrode 326a of the semiconductor chip 320 is electrically connected with the electrode 426a of the semiconductor chip 420 via the first wiring 360a, via 381a, third wiring 390, via 481a and first wiring 460a. In this way, in the semiconductor package 300 related to the third embodiment of the present invention, while the semiconductor chips 320 and 420 including an electrode on one surface have a structure in which the surfaces including an electrode are made the same and arranged in alignment, it is possible to electrically connect an electrode of one semiconductor chip via wiring arranged on the upper part of the other semiconductor chip and form a circuit using both semiconductor chips within one package. Therefore, in the semiconductor package 300 related to the third embodiment of the present invention, it is possible to form a module electrically connecting chips and realize high functionality.

In addition, the second wiring 370 is connected to the semiconductor chip 320 via the via 371 having a comparatively large diameter. Similarly, the second wiring 470 is connected to the semiconductor chip 420 via the via 471 having a comparatively large diameter. Since it is possible to form the second wirings 370 and 470 on the same layer as the third wiring 390, it is possible to form an electric circuit of the semiconductor chip 320 and semiconductor chip 420 as described above and also reduce thermal resistance from the rear surfaces of the semiconductor chip 320 and semiconductor chip 420 to the surface of the semiconductor package 300. Similarly, it is possible to reduce thermal resistance from the element surfaces arranged with an electrode of the semiconductor chip 320 and 420 to the surface of the semiconductor package 300.

Modified Example

Figure 34:
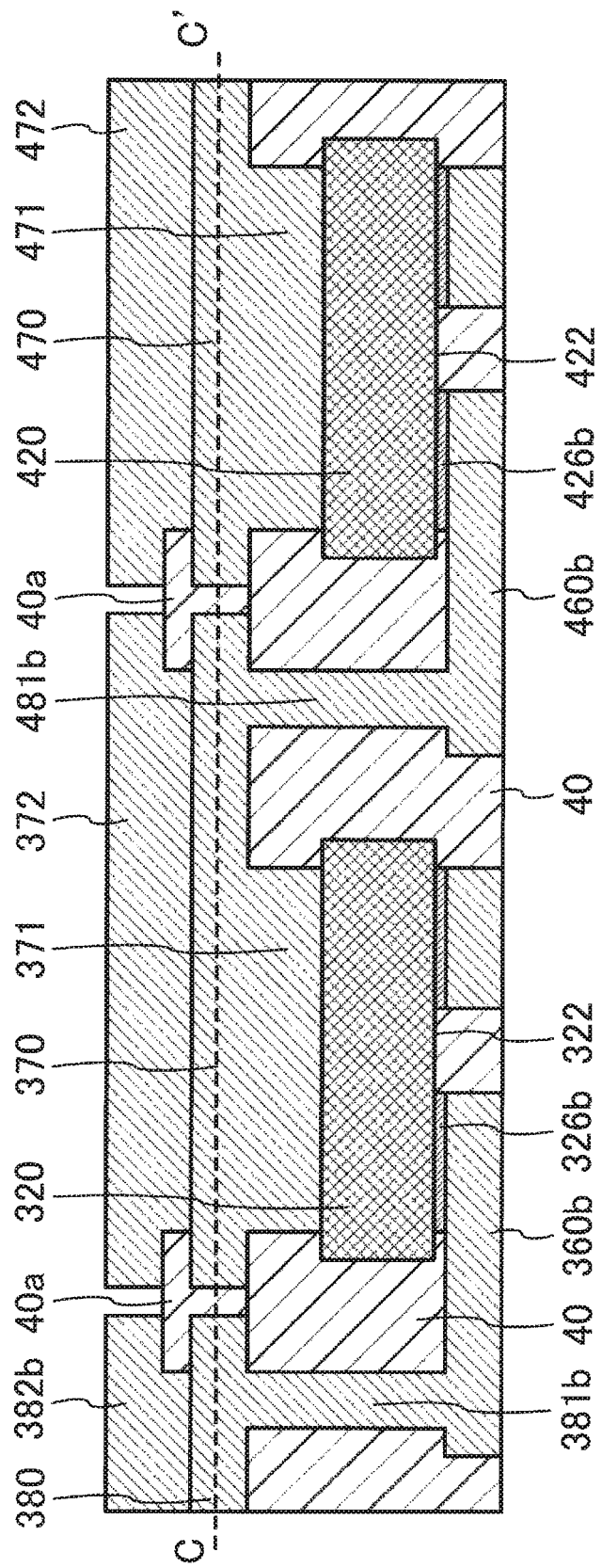
FIG. 34 is a perpendicular cross-sectional diagram showing a modified example of a semiconductor package related to a third embodiment of the present invention.
Figure 35:
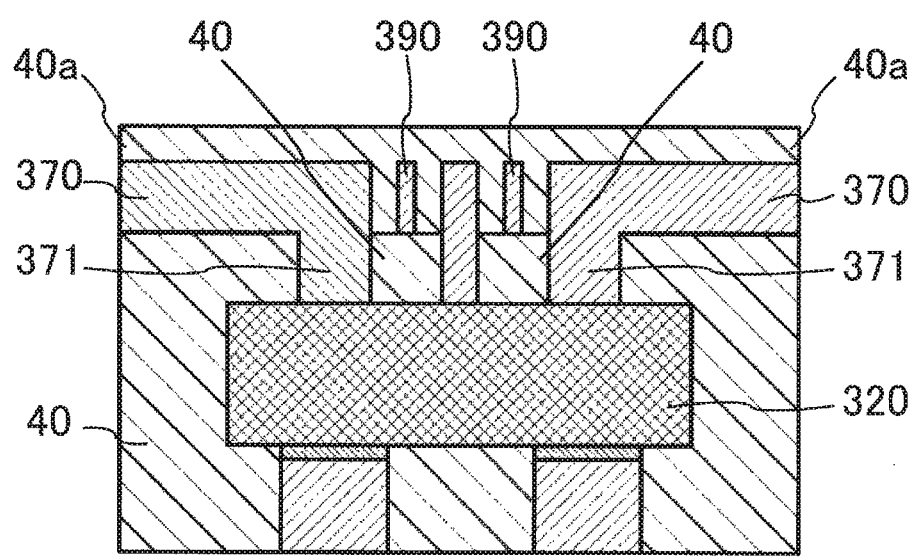
FIG. 35 is a perpendicular cross-sectional diagram showing a manufacturing process of a modified example of a semiconductor package related to a third embodiment of the present invention.
Figure 36:
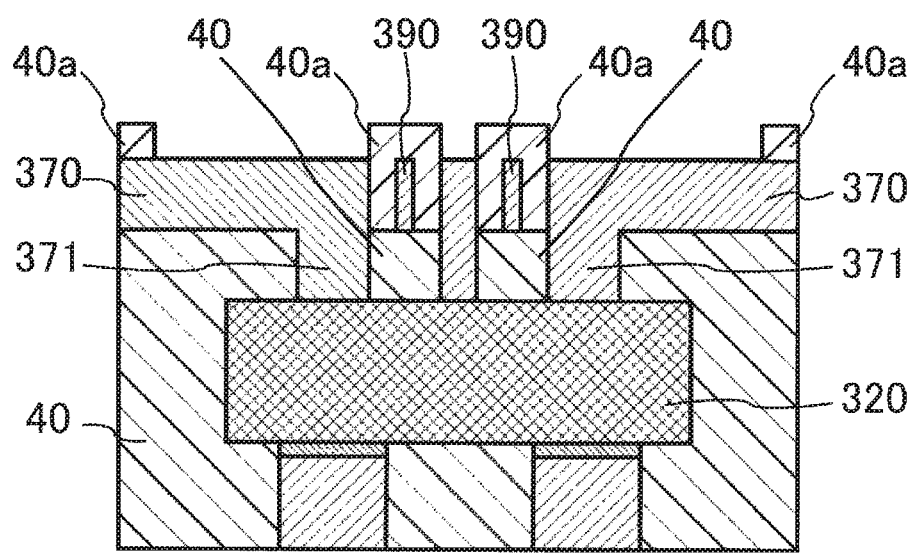
FIG. 36 is a perpendicular cross-sectional diagram showing a manufacturing process of a modified example of a semiconductor package related to a third embodiment of the present invention.
Figure 37:
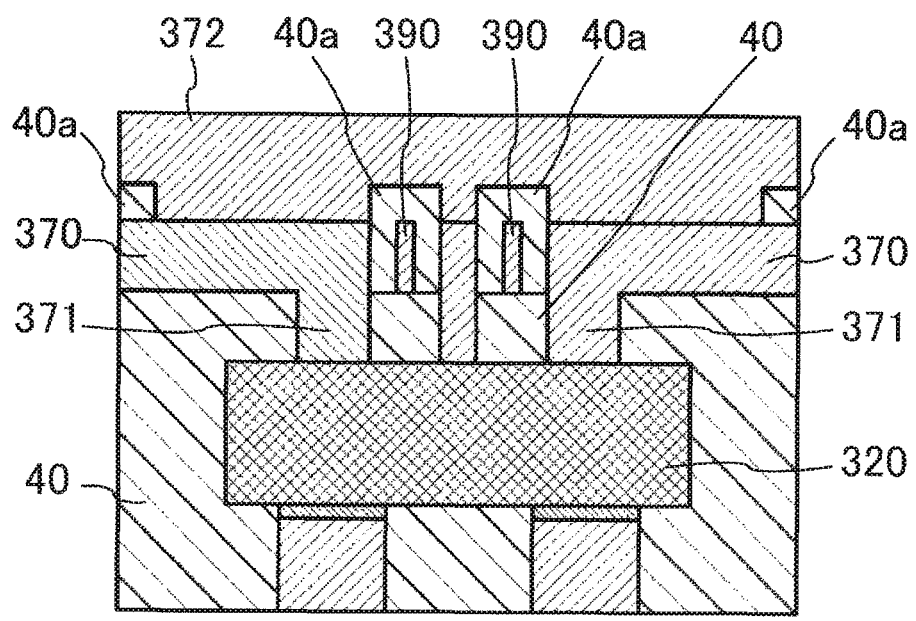
FIG. 37 is a perpendicular cross-sectional diagram showing a modified example of a semiconductor package related to a third embodiment of the present invention.

A modified example of the third embodiment is explained using FIG. 34 to FIG. 37. FIG. 34 and FIG. 37 are perpendicular cross sectional diagrams of a semiconductor package related to a modified example of the third embodiment of the present invention. FIG. 34 is a perpendicular cross sectional diagram along the line B-B' in FIG. 30 and corresponds to FIG. 32. Also, FIG. 30 show a horizontal cross sectional diagram along the line C-C' in FIG. 34. FIG. 30 shows the gap between the wiring 380 and second wiring 370. On the other hand, in this modified example, the resin 40a is filled between the second wiring 370 and the second wiring 470. FIG. 35 is a perpendicular cross sectional diagram along the line D-D' in FIG. 30 and corresponds to FIG. 33. In addition, FIG. 35, FIG. 36 and FIG. 37 are diagrams showing a manufacturing process of a modified example of the third embodiment. A process in which the modified example of the third embodiment is formed is shown in sequence from FIG. 32, FIG. 35, FIG. 36 and FIG. 37 showing the third embodiment.

A manufacturing method of a modified example of the third embodiment is explained. First, a resin 40a is filled on an upper surface of the semiconductor package 300 of the third embodiment (see FIG. 35). A non-photosensitive resin or photosensitive resin may be used as the resin 40a the same as the resin 40. When FIG. 35 is referred to, the side surface and upper surface of the second wiring 370 and wiring 390 are covered by the resin 40a. Although not shown in FIG. 35, the side surface and upper surface of the second wiring 470 and wiring 380 are also covered by the resin 40a.

Next, an opening is formed in the resin 40a and a part or the entire upper surface of the second wiring 370 is exposed (FIG. 36). Furthermore, since an opening is not formed in the upper surface of the third wiring 390, the third wiring 390 remains in an embedded state in the resin 40a.

Next, a fourth wiring 372 is formed in an opening formed in the resin 40a and on an upper surface of resin 40a (see FIG. 37). The fourth wiring 372 is formed by field plating Cu using a plating method the same as explained in the formation method of the second wiring 70 in the first embodiment. Although not shown in FIG. 35 to FIG. 37, the fourth wiring 472 and 382 are also formed by the same method as the formation method of the fourth wiring 372 described above.

FIG. 34 and FIG. 37 shows a modification of the third embodiment of the present invention. The fourth wiring 372, 472 and 382b are arranged above the second wiring 370, second wiring 470 and wiring 380. The modified example in the third embodiment of the present invention can increase an allowable current from a rear surface of the semiconductor chips 320 and 420 to an upper surface of a semiconductor package more than the third embodiment by providing the structure described above. In this way, it is possible to flow a larger current and prevent fusing due to an excess current.

Figure 38:
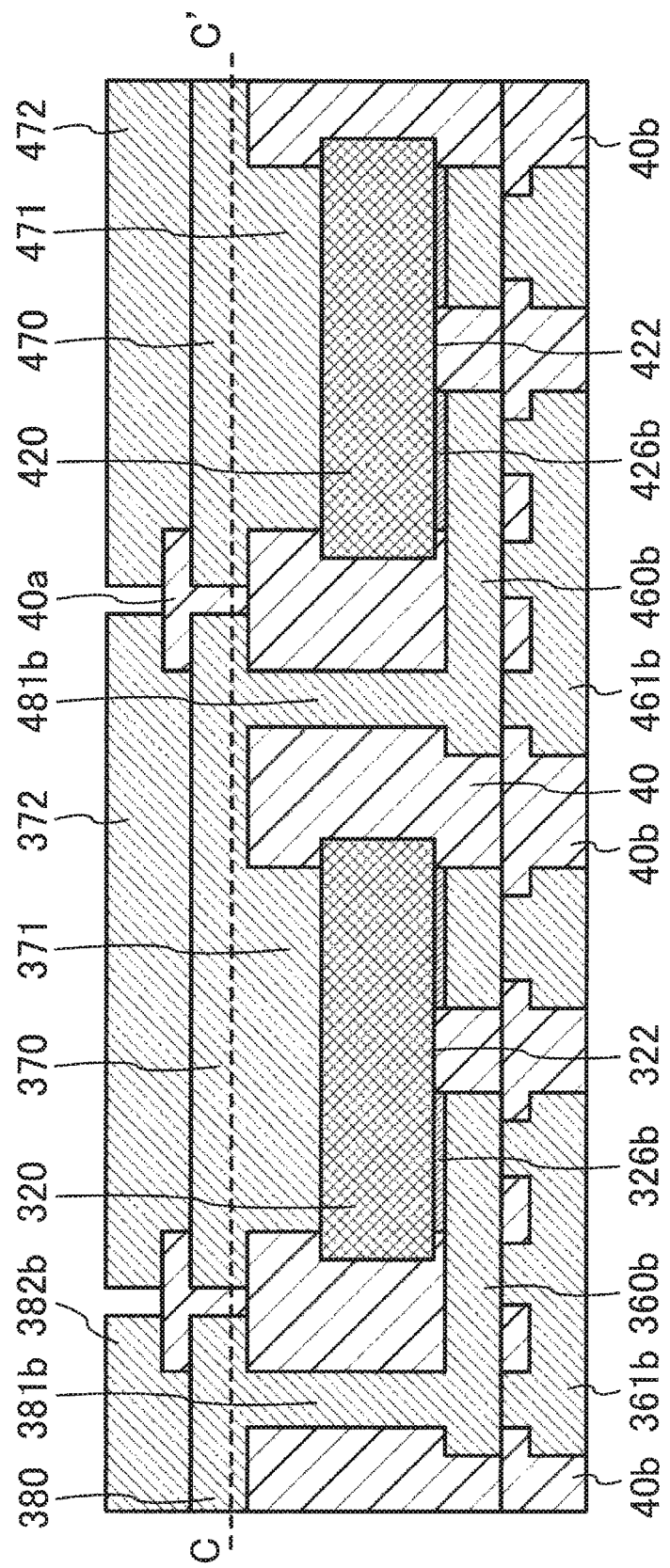
FIG. 38 is a perpendicular cross-sectional diagram showing another modified example of a semiconductor package related to a third embodiment of the present invention.
Figure 39:
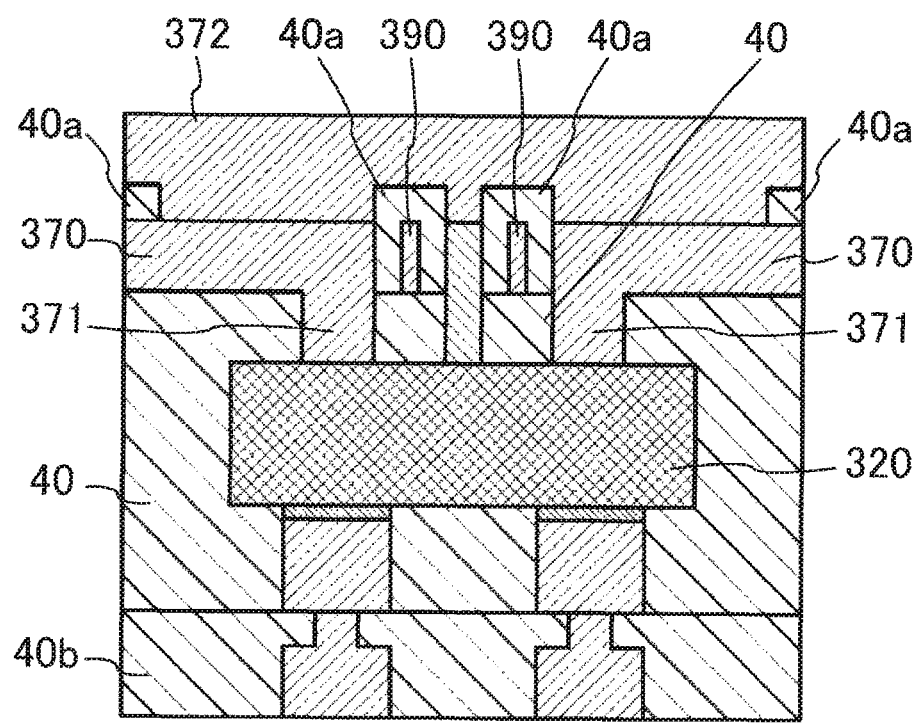
FIG. 39 is a perpendicular cross-sectional diagram showing another modified example of a semiconductor package related to a third embodiment of the present invention.

Next, another modified example of a semiconductor package related to the third embodiment of the present invention is explained using FIG. 38 and FIG. 39.

FIG. 38 and FIG. 39 shows a perpendicular cross sectional diagram of the semiconductor package according to another modification example of the third embodiment of the present invention. FIG. 38 show a perpendicular cross sectional diagram along the line B-B' in FIG. 30. Also, FIG. 30 show a horizontal cross sectional diagram along the line C-C' in FIG. 38. FIG. 30 shows the gap between the wiring 380 and second wiring 370. On the other hand, in this modified example, the resin 40a is filled between the second wiring 370 and the second wiring 470. FIG. 39 is a perpendicular cross sectional diagram along the line D-D' in FIG. 30 and corresponds to FIG. 33. In another modified example which is shown in FIG. 38 and FIG. 39, a fifth wiring 361b and 461b are further formed on a lower side of the first wiring 360b and 460b from the modified example of the third embodiment described above. The material and formation method of the fifth wiring 361b, 461b and resin 40b are the same as the example described above.

The other modified example shown in FIG. 38 and FIG. 39 can increase an allowable current from an element surface arranged with an electrode of the semiconductor chips 320 and 420 to an upper surface of a semiconductor package more than the third embodiment by providing the structure described above. In this way, it is possible to flow a larger current and prevent fusing due to an excess current.

The embodiments and modified examples of the present invention were explained above using FIG. 1 to FIG. 39. Furthermore, the present invention is not limited to the embodiments etc. described above and can be appropriately modified within a scope that does not depart from the substance of the present invention.

According to one embodiment of the present invention, it is possible to reduce thermal resistance from an element surface arranged with an electrode of a semiconductor chip to a surface of a semiconductor package. In addition, it is possible to easily realize split patterning of a metal, significantly reduce stress produced by a thermal expansion coefficient difference between silicon and metal, and improve environment reliability. In addition, it is possible to realize low cost by manufacturing a semiconductor package without using a TIM material.

What is claimed is:

1. A semiconductor package comprising:
   a first semiconductor chip and a second semiconductor chip, each including a first surface having a first electrode and a second electrode, and a second surface over and opposed to the first surface, the first semiconductor chip and the second semiconductor chip being covered with a resin;
   a first wiring over the resin, the first wiring connecting the first electrodes of the first semiconductor chip and the second semiconductor chip to each other via a first opening and a second opening arranged in the resin; and
   a second wiring directly connecting the second surface of the first semiconductor chip to the second electrode of the second semiconductor chip via a third opening arranged in the resin.

2. The semiconductor package according to claim 1, wherein the first wiring has a stacked structure of Au, Ni and Cu in this order.

3. The semiconductor package according to claim 1, wherein the second wiring has a stacked structure of a barrier metal and Cu.

4. The semiconductor package according to claim 1, further comprising a plurality of openings in the resin, the plurality of openings overlapping with the second surface of the first semiconductor chip.

5. The semiconductor package according to claim 1, wherein the second wiring has a slit overlapping with the first semiconductor chip.

6. The semiconductor package according to claim 5, wherein the slit has a circular shape, a L-shape, or an arc shape.

7. The semiconductor package according to claim 1, wherein the third opening is located between the first semiconductor chip and the second semiconductor chip.

8. The semiconductor package according to claim 1, wherein the first wiring overlaps with the first semiconductor chip.

9. The semiconductor package according to claim 1, wherein the second semiconductor chip is arranged to be closer to the second opening than the first opening.

10. The semiconductor package according to claim 1, wherein the first semiconductor chip is arranged so as to be sandwiched between the first opening and the second opening.

* * * * *